(12) United States Patent
De Groot

(10) Patent No.: US 7,456,975 B2
(45) Date of Patent: *Nov. 25, 2008

(54) METHODS AND SYSTEMS FOR INTERFEROMETRIC ANALYSIS OF SURFACES AND RELATED APPLICATIONS

(75) Inventor: Peter J. De Groot, Middletown, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/942,166

(22) Filed: Nov. 19, 2007

(65) Prior Publication Data

US 2008/0068614 A1 Mar. 20, 2008

Related U.S. Application Data

(63) Continuation of application No. 10/941,649, filed on Sep. 15, 2004, now Pat. No. 7,298,494.

(60) Provisional application No. 60/502,932, filed on Sep. 15, 2003, provisional application No. 60/502,933, filed on Sep. 15, 2003, provisional application No. 60/502,907, filed on Sep. 15, 2003, provisional application No. 60/502,930, filed on Sep. 15, 2003, provisional application No. 60/539,437, filed on Jan. 26, 2004.

(51) Int. Cl.
*G01B 11/02* (2006.01)

(52) U.S. Cl. ...................... 356/497; 356/511
(58) Field of Classification Search .......... 356/497, 356/503, 504, 511, 512

See application file for complete search history.

(56) References Cited

U.S. PATENT DOCUMENTS

| 2,612,074 A | 9/1952 | Mirau |
| 4,188,122 A | 2/1980 | Massie et al. |
| 4,199,219 A | 4/1980 | Suzuki et al. |
| 4,340,306 A | 7/1982 | Balasubramanian |

(Continued)

FOREIGN PATENT DOCUMENTS

DE    4108944    9/1992

(Continued)

OTHER PUBLICATIONS

C. Akcay et al., "Spectral shaping to improve the point spread function in optical coherence tomography", *Optics Letters*, vol. 28 No. 20, pp. 1921-1923 (Oct. 15, 2003).

(Continued)

*Primary Examiner*—Michael A Lyons
(74) *Attorney, Agent, or Firm*—Fish & Richardson P.C.

(57) ABSTRACT

A method for determining a spatial property of an object includes obtaining a scanning low coherence interference signal from a measurement object that includes two or more interfaces. The scanning low coherence interference signal includes two or more overlapping low coherence interference signals, each of which results from a respective interface. Based on the low coherence interference signal, a spatial property of at least one of the interfaces is determined. In some cases, the determination is based on a subset of the low coherence interference signal rather than on the entirety of the signal. Alternatively, or in addition, the determination can be based on a template, which may be indicative of an instrument response of the interferometer used to obtain the low coherence interference signal.

25 Claims, 24 Drawing Sheets

U.S. PATENT DOCUMENTS

| | | |
|---|---|---|
| 4,355,903 A | 10/1982 | Sandercock |
| 4,523,846 A | 6/1985 | Breckinridge et al. |
| 4,576,479 A | 3/1986 | Downs |
| 4,583,858 A | 4/1986 | Lebling et al. |
| 4,618,262 A | 10/1986 | Maydan et al. |
| 4,639,139 A | 1/1987 | Wyant et al. |
| 4,660,980 A | 4/1987 | Takabayashi et al. |
| 4,710,642 A | 12/1987 | McNeil |
| 4,806,018 A | 2/1989 | Falk |
| 4,818,110 A | 4/1989 | Davidson |
| 4,869,593 A | 9/1989 | Biegen |
| 4,923,301 A | 5/1990 | White |
| 4,948,253 A | 8/1990 | Biegen |
| 4,964,726 A | 10/1990 | Kleinknecht et al. |
| 4,999,014 A | 3/1991 | Gold et al. |
| 5,042,949 A | 8/1991 | Greenberg et al. |
| 5,042,951 A | 8/1991 | Gold et al. |
| 5,073,018 A | 12/1991 | Kind et al. |
| 5,112,129 A | 5/1992 | Davidson et al. |
| 5,129,724 A | 7/1992 | Brophy et al. |
| 5,133,601 A | 7/1992 | Cohen et al. |
| 5,135,307 A | 8/1992 | de Groot et al. |
| 5,153,669 A | 10/1992 | DeGroot |
| 5,164,790 A | 11/1992 | McNeil et al. |
| 5,166,751 A | 11/1992 | Massig |
| 5,173,746 A | 12/1992 | Brophy |
| 5,194,918 A | 3/1993 | Kind et al. |
| 5,241,369 A | 8/1993 | McNeil et al. |
| 5,301,010 A | 4/1994 | Jones et al. |
| 5,355,221 A | 10/1994 | Cohen et al. |
| 5,384,717 A | 1/1995 | Ebenstein |
| 5,386,119 A | 1/1995 | Ledger |
| 5,390,023 A | 2/1995 | Biegen |
| 5,398,113 A | 3/1995 | de Groot |
| 5,402,234 A | 3/1995 | Deck |
| 5,459,564 A | 10/1995 | Chivers |
| 5,471,303 A | 11/1995 | Ai et al. |
| 5,481,811 A | 1/1996 | Smith |
| 5,483,064 A | 1/1996 | Frey et al. |
| 5,539,517 A | 7/1996 | Cabib et al. |
| 5,543,841 A | 8/1996 | Kanamori |
| 5,555,471 A | 9/1996 | Xu et al. |
| 5,587,792 A | 12/1996 | Nishizawa et al. |
| 5,589,938 A | 12/1996 | Deck |
| 5,602,643 A | 2/1997 | Barrett |
| 5,633,714 A | 5/1997 | Nyyssonen |
| 5,640,270 A | 6/1997 | Aziz et al. |
| 5,703,692 A | 12/1997 | McNeil et al. |
| 5,757,502 A | 5/1998 | Weling |
| 5,774,224 A | 6/1998 | Kerstens |
| 5,777,740 A | 7/1998 | Lacey et al. |
| 5,777,742 A | 7/1998 | Marron |
| 5,784,164 A | 7/1998 | Deck et al. |
| 5,856,871 A | 1/1999 | Cabib et al. |
| 5,867,276 A | 2/1999 | McNeil et al. |
| 5,880,838 A | 3/1999 | Marx et al. |
| 5,900,633 A | 5/1999 | Solomon et al. |
| 5,912,741 A | 6/1999 | Carter et al. |
| 5,923,423 A | 7/1999 | Sawati et al. |
| 5,953,124 A | 9/1999 | Deck |
| 5,956,141 A | 9/1999 | Hayashi |
| 5,963,329 A | 10/1999 | Conrad et al. |
| 6,028,670 A | 2/2000 | Deck |
| 6,160,621 A | 12/2000 | Perry et al. |
| 6,242,739 B1 | 6/2001 | Cherkassky |
| 6,249,351 B1 | 6/2001 | de Groot |
| H1972 H | 7/2001 | Inoue |
| 6,259,521 B1 | 7/2001 | Miller et al. |
| 6,275,297 B1 | 8/2001 | Zalicki |
| 6,377,349 B1 | 4/2002 | Fercher |
| 6,381,009 B1 | 4/2002 | McGahan |
| 6,392,749 B1 | 5/2002 | Meeks et al. |
| 6,417,109 B1 | 7/2002 | Jordan et al. |
| 6,429,943 B1 | 8/2002 | Opsal et al. |
| 6,449,066 B1 | 9/2002 | Arns et al. |
| 6,483,580 B1 | 11/2002 | Xu et al. |
| 6,500,591 B1 | 12/2002 | Adams |
| 6,507,405 B1 | 1/2003 | Grek et al. |
| 6,545,761 B1 | 4/2003 | Aziz et al. |
| 6,545,763 B1 | 4/2003 | Kim et al. |
| 6,590,656 B2 | 7/2003 | Xu et al. |
| 6,597,460 B2 | 7/2003 | Groot et al. |
| 6,611,330 B2 | 8/2003 | Lee et al. |
| 6,624,894 B2 | 9/2003 | Olszak et al. |
| 6,633,389 B1 | 10/2003 | Poris et al. |
| 6,633,831 B2 | 10/2003 | Nikoonahad et al. |
| 6,636,322 B1 | 10/2003 | Terashita |
| 6,694,284 B1 | 2/2004 | Nikoonahad et al. |
| 6,714,307 B2 | 3/2004 | De Groot et al. |
| 6,721,094 B1 | 4/2004 | Sinclair et al. |
| 6,741,357 B2 | 5/2004 | Wang et al. |
| 6,741,360 B2 | 5/2004 | D'Agraives et al. |
| 6,775,006 B2 | 8/2004 | De Groot et al. |
| 6,775,009 B2 | 8/2004 | Hill |
| 6,798,511 B1 | 9/2004 | Zhan et al. |
| 6,822,745 B2 | 11/2004 | De Groot et al. |
| 6,856,384 B1 | 2/2005 | Rovira |
| 6,888,638 B1 | 5/2005 | Hill |
| 6,891,627 B1 | 5/2005 | Levy et al. |
| 6,909,509 B2 | 6/2005 | DeGroot |
| 6,925,860 B1 | 8/2005 | Poris et al. |
| 6,940,604 B2 | 9/2005 | Jung et al. |
| 6,956,658 B2 | 10/2005 | Meeks et al. |
| 6,956,660 B2 | 10/2005 | Meeks et al. |
| 6,985,232 B2 | 1/2006 | Sezginer |
| 6,989,905 B2 | 1/2006 | De Groot |
| 6,999,180 B1 | 2/2006 | Janik et al. |
| 7,012,700 B2 | 3/2006 | de Groot et al. |
| 7,018,271 B2 | 3/2006 | Wiswesser et al. |
| 7,046,371 B2 | 5/2006 | De Lega et al. |
| 7,061,623 B2 | 6/2006 | Davidson |
| 7,068,376 B2 | 6/2006 | De Groot |
| 7,088,451 B2 | 8/2006 | Sezginer |
| 7,102,761 B2 | 9/2006 | De Lega et al. |
| 7,106,454 B2 | 9/2006 | De Groot et al. |
| 7,119,909 B2 | 10/2006 | Unruh et al. |
| 7,139,081 B2 | 11/2006 | De Groot |
| 7,139,083 B2 | 11/2006 | Fielden et al. |
| 7,142,311 B2 | 11/2006 | De Lega |
| 7,177,030 B2 | 2/2007 | Leizerson |
| 7,239,398 B2 | 7/2007 | De Groot et al. |
| 7,271,918 B2 | 9/2007 | De Groot et al. |
| 7,283,248 B2 | 10/2007 | Hill |
| 7,289,225 B2 | 10/2007 | de Groot |
| 7,298,494 B2 | 11/2007 | de Groot |
| 7,304,747 B2 | 12/2007 | De Lega |
| 7,315,382 B2 | 1/2008 | De Groot |
| 7,324,210 B2 | 1/2008 | De Groot et al. |
| 7,324,214 B2 | 1/2008 | De Groot et al. |
| 2002/0015146 A1 | 2/2002 | Meeks et al. |
| 2002/0135775 A1 | 9/2002 | de Groot et al. |
| 2002/0196450 A1 | 12/2002 | Olszak et al. |
| 2003/0011784 A1 | 1/2003 | de Groot et al. |
| 2003/0048458 A1 | 3/2003 | Mieher et al. |
| 2003/0075721 A1 | 4/2003 | Li |
| 2003/0112444 A1 | 6/2003 | Yang et al. |
| 2003/0137671 A1 | 7/2003 | De Groot et al. |
| 2003/0197871 A1 | 10/2003 | De Groot |
| 2004/0027576 A1 | 2/2004 | De Groot et al. |
| 2004/0075843 A1 | 4/2004 | Marron et al. |
| 2004/0085544 A1 | 5/2004 | de Groot et al. |
| 2004/0185582 A1 | 9/2004 | Kueny |
| 2004/0189999 A1 | 9/2004 | de Groot et al. |
| 2004/0233442 A1 | 11/2004 | Mieher et al. |

| | | | |
|---|---|---|---|
| 2004/0233444 | A1 | 11/2004 | Mieher et al. |
| 2004/0246493 | A1 | 12/2004 | Kim et al. |
| 2005/0057757 | A1 | 3/2005 | de Lega et al. |
| 2005/0068540 | A1 | 3/2005 | de Groot et al. |
| 2005/0073692 | A1 | 4/2005 | de Groot et al. |
| 2005/0078318 | A1 | 4/2005 | de Groot |
| 2005/0078319 | A1 | 4/2005 | de Groot |
| 2005/0088663 | A1 | 4/2005 | de Groot et al. |
| 2005/0146727 | A1 | 7/2005 | Hill |
| 2005/0179911 | A1 | 8/2005 | Boomgarden et al. |
| 2005/0225769 | A1 | 10/2005 | Bankhead et al. |
| 2005/0237534 | A1 | 10/2005 | Deck |
| 2005/0237537 | A1 | 10/2005 | Leizerson et al. |
| 2006/0012582 | A1 | 1/2006 | de Lega |
| 2006/0119841 | A1 | 6/2006 | Saunders et al. |
| 2006/0158657 | A1 | 7/2006 | De Lega et al. |
| 2006/0158658 | A1 | 7/2006 | Colonna de Lega et al. |
| 2006/0158659 | A1 | 7/2006 | Colonna de Lega et al. |
| 2006/0187465 | A1 | 8/2006 | De Groot |
| 2006/0262321 | A1 | 11/2006 | De Groot |
| 2007/0008551 | A1 | 1/2007 | Tang |
| 2007/0046953 | A1 | 3/2007 | de Groot et al. |
| 2007/0081167 | A1 | 4/2007 | De Groot |
| 2007/0086013 | A1 | 4/2007 | De Lega et al. |
| 2007/0091317 | A1 | 4/2007 | Freischlad et al. |
| 2007/0091318 | A1 | 4/2007 | Freischlad et al. |
| 2007/0097380 | A1 | 5/2007 | De Groot et al. |
| 2007/0127036 | A1 | 6/2007 | Liao et al. |
| 2007/0139656 | A1 | 6/2007 | Wan |
| 2007/0247637 | A1 | 10/2007 | De Groot |
| 2008/0018901 | A1 | 1/2008 | de Groot |
| 2008/0088849 | A1 | 4/2008 | de Lega et al. |

FOREIGN PATENT DOCUMENTS

| | | |
|---|---|---|
| DE | 4309056 | 9/1994 |
| EP | 0 397 388 A2 | 11/1990 |
| EP | 0 549 166 A2 | 6/1993 |
| EP | 0 617 255 A1 | 9/1994 |
| EP | 0 929 094 A2 | 7/1999 |
| GB | 2385417 | 8/2003 |
| JP | 8327327 | 12/1996 |
| JP | 2000121317 | 4/2000 |
| KR | 20000061037 | 10/2000 |
| WO | WO 93/24805 | 12/1993 |
| WO | WO 95/09343 | 4/1995 |
| WO | WO 97/44633 | 11/1997 |
| WO | WO 02/082008 | 10/2002 |
| WO | WO 03/036229 | 5/2003 |
| WO | WO 03/062802 | 7/2003 |
| WO | WO 2004/023071 | 3/2004 |
| WO | WO 2005/029192 | 3/2005 |

OTHER PUBLICATIONS

R.M.A. Azzam et al., "Reflection and Transmission of Polarized Light by Stratified Planar Structures", *Ellipsometry and Polarized Light*, Elsevier Science B. V. ISBN 0 444 87016 4 (Paperback) pp. 267-363 (1987).

M. Bashkansky et al., "Signal Processing for Improving Field Cross-correlation Function in Optical Coherence Tomography", *Supplement to Optics & Photonics News*, 9(5) (May 1998).

A. Bosseboeuf et al., "Application of microscopic interferometry techniques in the MEMS field", *Proceedings of SPIE*, vol. 5145, pp. 1-16 (2003).

M. Davidson et al., "An Application of Interference Microscopy to Integrated Circuit Inspection and metrology", *Proceedings SPIE*, vol. 775, pp. 233-247 (1987).

T. Dresel et al., "Three-dimensional sensing of rough surfaces by coherence radar", *Applied Optics*, vol. 31, No. 7, pp. 919-925 (Mar. 1, 1992).

J.E. Greivenkamp, "Generalized data reduction for heterodyne interferometry", *Optical Engineering.*, vol. 23 No. 4, pp. 350-352 (Jul./Aug. 1984).

P. de Groot, "Derivation of algorithms for phase-shifting interferometry using the concept of a data-sampling window", *Appl. Opt.*, 34(22), p. 4723-4730 (1995).

P. de Groot et al., "Signal modeling for modern interference microscopes", *SPIE Proceedings*, 5457-4 (2004).

Peter de Groot et al., "Determination of fringe order in white-light interference microscopy", *Appl. Opt.*, 41(22) pp. 4571-4578 (2002).

Feke, Gilbert D. et al., "Interferometric back focal plane microellipsometry", *Applied Optics*, vol. 37, No. 10, pp. 1796-1802 (Apr. 1, 1998).

P.A. Flournoy et al., "White-light interferometric thickness gauge", *Appl. Opt.*, 11(9), pp. 1907-1915 (1972).

G. Hausler et al., "Coherence Radar and Spectral Radar—New Tools for Dermatological Diagnosis", *Journal of Biomedical Optics*, vol. 3, No. 1, pp. 21-31 (Jan. 1998).

R.D. Holmes et al., "Scanning microellipsometry for extraction of true topography", *Electronics Letters*, vol. 31, No. 5, pp. 358-359 (Mar. 2, 1995).

Kim, Seung-Woo et al., "Thickness-profile measurement of transparent thin-film layers by white-light scanning interferometry", *Applied Optics*, vol. 38, No. 28, pp. 5968-5973 (Oct. 1, 1999).

Kino, Gordon S. et al., "Mirau correlation microscope", *Applied Optics*, vol. 29, No. 26, pp. 3775-3783 (Sep. 10, 1990).

Kieran G. Larkin, "Efficient nonlinear algorithm for envelope detection in white light interferometry", *Journal of the Optical Society for America A*, vol. 13, No. 4, pp. 832-843 (1996).

Lee et al., "Profilometry with a coherence scanning microscope", *Appl. Opt.*, 29(26), pp. 3784-3788 (1990).

I. Lee-Bennett, "Advances in non-contacting surface metrology", *OF&T Workshop*, papter OTuC1 (2004).

K. Leonhardt et al., "Micro-Ellipso-Height-Profilometry", *Optics Communications*, vol. 80, No. 3, 4, pp. 205-209 (Jan. 1, 1991).

Y. Liu et al., "Common path interferometric microellipsometry", *SPIE*, vol. 2782, pp. 635-645 (1996).

Lyakin et al., "The interferometric system with resolution better than coherence length for determination of geometrical thickness and refractive index of a layer object", *Proceedings of the SPIE—The International Society for Optical Engineering SPIE-INT. Soc. Opt. Eng USA*, vol. 4956, pp. 163-169 (Jul. 2003).

C.J. Morgan, "Least-Squares estimation in phase-measurement interferometry", *Optics Letters*, 7(8), pp. 368-370 (1982).

Ngoi et al., "Phase-shifting interferometry immune to vibration", *Applied Optics*, vol. 40, No. 19, pp. 3211-3214 (2001).

Novak et al., "Template-based software for accurate MEMS characterization", *Proceedings of SPIE*, Fol. 4980, pp. 75-80 (2003).

A.V. Oppenheim et al., "10.3: The time-dependent Fourier Transform", *Discrete-Time Signal Processing*, 2$^{nd}$ Edition, pp. 714-722 (Prentice Hall, New Jersey, 1999).

M.C. Park et al., "Direct quadratic polynomial fitting for fringe peak detection of white light scanning interferograms", *Optical Engineering*, vol. 39, No. 4, pp. 952-959 (2000).

S. Pettigrand et al., "Mesures 3D de topographies to de vibrations a l'echelle (sub)micrometrique par microscopie optique interferometrique", *Proc. Club CMOI, Methodes et Techniques Optiques pour l'Industrie*, (2002).

M. Pluta, "Advanced light microscopy", vol. 3, PWN—Polish Scientific Publishers (Elsevier, Amsterdam), pp. 265-271 (1993).

W.H. Press et al., "Linear Correlation", *Numerical Recipes in C*, Cambridge University Press, 2$^{nd}$ Edition, pp. 636-639 (1992).

Rosencwaig, Allan et al., "Beam profile reflectometry: A new technique for dielectric film measurements", *Applied Physics Letters*, vol. 60, No. 11, pp. 1301-1303 (Mar. 16, 1992).

P. Sandoz et al., "Optical implementation of frequency domain analysis for white light interferometry", *Proceedings SPIE*, vol. 2545, pp. 221-228 (Jun. 1995).

P. Sandoz et al., "High-resolution profilometry by using phase calculation algorithms for spectroscopic analysis of white-light interferograms", *Journal of Modern Optics*, vol. 43, No. 4, pp. 701-708 (1996).

Sandoz, Patrick "Wavelet transform as a processing tool in white-light interferometry", *Optics Letters*, vol. 22, No. 14, pp. 1065-1067 (Jul. 15, 1997).

P. Sandoz et al., "Processing of white light correlograms: simultaneous phase and envelope measurements by wavelet transformation", *SPIE*, vol. 3098, pp. 73-82 (1997).

U. Schnell et al., "Dispersive white-light interferometry for absolute distance measurement with dielectric multilayer systems on the target", *Optics Letters*, vol. 21, No. 7, pp. 528-530 (Apr. 1996).

J. Schwider et al., "Dispersive interferometric profilometer", *Optics Letters*, vol. 19, No. 13, pp. 995-997 (Jul. 1994).

C.W. See et al., "Scanning optical microellipsometer for pure surface profiling", *Applied Optics*, vol. 35, No. 34, pp. 6663-6668 (Dec. 1, 1996).

Shatalin, S.V. et al., "Reflection conoscopy and micro-ellipsometry of isotropic thin film structures", *Journal of Microscopy*, vol. 179, Part 3, pp. 241-252 (Sep. 1995).

M. Totzeck, "Numerical simulation of high-NA quantitative polarization microscopy and corresponding near-fields", *Optik*, vol. 112, No. 9, pp. 399-406 (2001).

R. Tripathi et al., "Spectral shaping for non-Gaussian source spectra in optical coherence tomography", *Optics Letters*, vol. 27, No. 6, pp. 406-408 (Mar. 15, 2002).

D. Willenborg et al, "A novel micro-spot dielectric film thickness measurement system", *SPIE*, vol. 1594, pp. 322-333 (1991).

R.M.A. Azzam et al, "Ellipsometric function of a film-substrate system: Applications to the design of reflection-type optical devices and to ellipsometry", *Journal of the Optical Society of America*, vol. 5, Issue 3, 252-260 (1975).

Berman et al., "Review of In Situ & In-line Detection for CMP Applications", *Semiconductor Fabtech—8th Edition*, pp. 267-274 (1998).

Kujawinska, Malgorzata, "5 Spatial Phase Measurement Methods", *Interferogram Analysis: Digital Fringe Pattern Measurement Techniques*, pp. 141-193 (IOP Publishing Ltd. 1993).

US 7,151,607, 12/2008, De Groot et al. (withdrawn).

Abdulhalim, "Spectroscopic interference microscopy technique for measurement of layer parameters", Meas. Sci. Technol., vol. 12, pp. 1996-2001 (2001).

Biegen, "Determination of the Phase Change on Reflection from Two-beam Interference," Optics Letters, 19:21:1690-1692, Nov. 1, 1994.

Bishop, et al., "Grating line shape characterization using scatterometry," SPIE 1545, 64-73 (1991).

Chim, et al., "Three-Dimensional Image Realization in Interference Microscopy", Applied Optics, May 10, 1992, vol. 31, No. 14.

Creath, "Step height measurement using two-wavelength phase-shifting interferometry", Applied Optics, vol. 26, No. 14, pp. 2810-2816 (Jul. 15, 1987).

Danielson et al., "Absolute Optical Ranging Using Low Coherence Interferometry," Applied Optics, 30:21:2975-2979, Jul. 20, 1991.

de Groot et al., "Angle-resolved three-dimensional analysis of surface films by coherence scanning interferometry", Optics Letters, vol. 32, No. 12, pp. 1638-1640 (Jun. 15, 2007).

de Groot et al.; "Three-dimensional imaging by sub-Nyquist sampling of white-light interfergrams"; Optics Letters vol. 18, No. 17; pp. 1462-1464, Sep. 1, 1993.

de Groot, "Extending the unambiguous range of two-color interferometers", Applied Optics, vol. 33, No. 25, pp. 5948-5953 (Sep. 1, 1994).

de Groot, "Three-color laser-diode interferometer", Applied Optics, vol. 30, No. 25, pp. 3612-3616 (Sep. 1, 1991).

de Groot, P., "Phase-shift calibration errors in interometers with spherical Fizeua cavities," Applied Optics, vol. 34:16, pp. 2856-2863 (Jun. 1, 1995).

de Lega, X., et al., "Optical topography measurement of patterned wafers," American Institute of Physics Conference Proceedings, vol. 788, pp. 432-436 (2005).

Debnath, S.K., et al., "Spectrally resolved phase-shifting interferometry of transparent thin films: sensitivity of thickness measurements," Appl. Opt. 45, 34 8636-8640 (2006).

Deck et al., "Two-color light-emitting-diode source for high-precision phase-shifting interferometry", Optics Letters, vol. 18, No. 22, pp. 1899-1901 (Nov. 15, 1993).

Gale et al., "Linnik microscope imaging of integrated circuit structures", Applied Optics vol. 35, No. 1, pp. 131-148 (Jan. 1, 1996).

Ghiglia et al., "Quality-Guided Path Following", Two-Dimensional Phase Unwrapping—Theory, Algorithms and Software, John Wiley & Sons publishers, ISBN 0-471-24935-1, pp. 122-136 (1998).

Hecht, "Basics of Coherence Theory," Optics, 2nd Ed., Addison Wesley, pp. 516-517 (1987).

Kleinknecht, et al., "Linewidth measurement on IC masks and wafers by grating test patterns," Appl. Opt. 19(4), 523-533 (1980).

Kohlhaas, et al., "High-Resolution OCDR for Testing Integrated-Optical Waveguides: Dispersion-Corrupted Experimental Data Corrected by a Numerical Algorithm", Journal of Lightwave Technology, Nov. 1991, vol. 9, No. 11.

Naqvi, et al., "Linewidth measurement of gratings of photomasks: a simple technique," Appl. Opt., 31(10), 1377-1384 (1992).

Onodera et al., "Two-wavelength interferometry that uses a Fourier-transform method", Applied Optics, vol. 37, No. 34, pp. 7988-7994 (Dec. 1, 1998).

Peng, S.T., et al., "Theory of Periodic Dielect Waveguides," IEEE Trans Microwave Theory and Technique MTT-23(1), 123-133 (1975).

Pfortner et al., "Red-green-blue interferometer for the metrology of discontinuous structures", Applied Optics, vol. 42, No. 4, pp. 667-673 (Feb. 1, 2003).

Raymond, C.J., "Scatterometry for Semiconductor Metrology," in Handbook of silicon semiconductor metrology, A.J. Deibold, Ed. (Marcel Dekker, Inc., New York 2001).

Raymond et al., "Scatterometry for CD measurements of etched structures," SPIE 2725, 720-728 (1996).

Schmit, J. et al., "Extended averaging technique for derivation of error-compensating algorithms in phase-shifting interferometry," Applied Optics, vol. 34:19, pp. 3610-3619 (Jul. 1, 1995).

See et al., "Scanning optical microellipsometer for pure surface profiling", Applied Optics, vol. 35, No. 34, pp. 6663-6668 (Dec. 1, 1996). cited by other.

Sheppard et al., "Effect of numerical aperture on interference fringe spacing", Applied Optics, vol. 34, No. 22, pp. 4731-4734 (Aug. 1, 1995).

Tzannes et al., "Measurement of the modulation transfer function of infrared cameras," Optical Engineering, vol. 34, No. 6, pp. 1808-1817 (Jun. 1995). cited by other.

Wyant, "Phase shifting interferometry" (1998).

Youngquist, et al., "Optical Coherence-Domain Reflectometry: a New Optical Evaluation Technique", Optical Letters, Mar. 1987, vol. 12, No. 3.

Zhan, Q., et al., "Measurement of surface features beyond the diffraction limit with an imaging ellipsometer," Opt. Lett. 27, 821-823 (2002).

PCT Search Report dated Jun. 10, 2008 by ISA/RO.

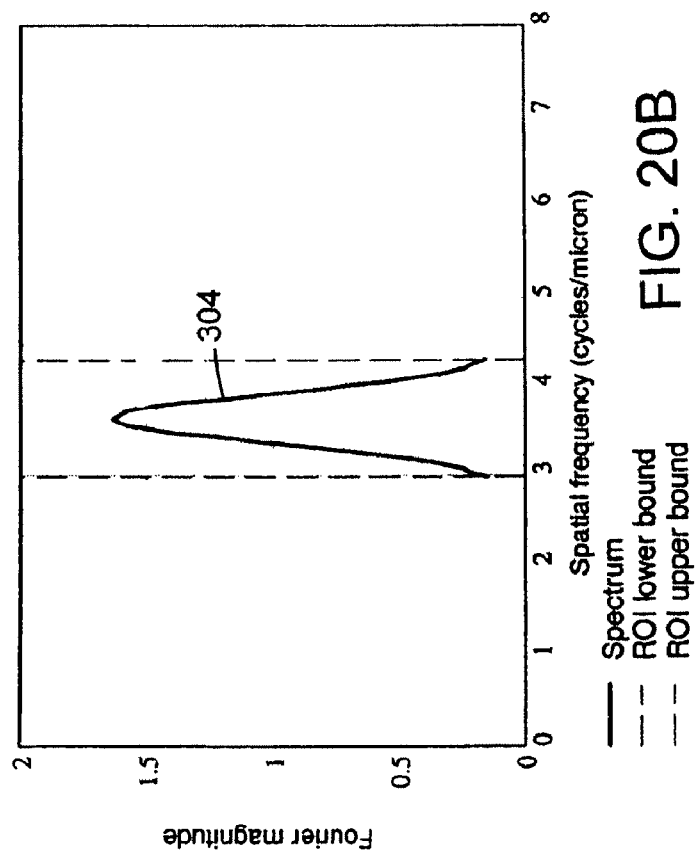
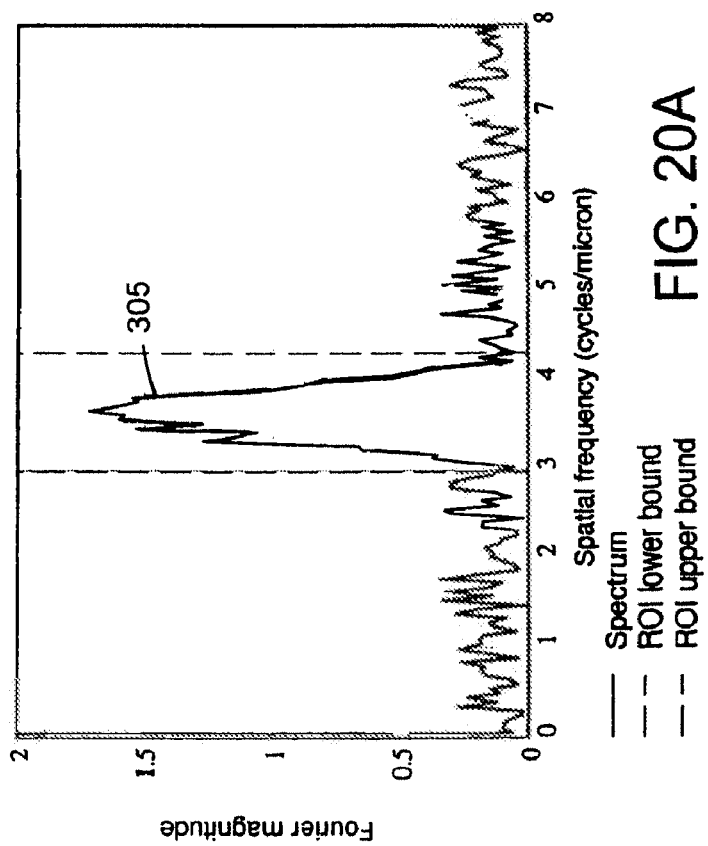
FIG. 20B
FIG. 20A

METHODS AND SYSTEMS FOR INTERFEROMETRIC ANALYSIS OF SURFACES AND RELATED APPLICATIONS

CROSS-REFERENCE TO RELATED APPLICATIONS

Pursuant to 35 USC § 120, this application is a continuation of and claims the benefit of U.S. application Ser. No. 10/941,649, filed Sep. 15, 2004 now U.S. Pat. No. 7,298,494, which claims the benefit of U.S. provisional application Nos. 60/502,932, filed Sep. 15, 2003; 60/502,933, filed Sep. 15, 2003; 60/502,907, filed Sep. 15, 2003; 60/502,930, filed Sep. 15, 2003; and 60/539,437, filed Jan. 26, 2004, for Surface Profiling Using An Interference Pattern Matching Template. The contents of the prior applications are incorporated herein by reference in their entirety.

FIELD OF THE INVENTION

The invention relates to interferometric analysis of objects, such as to interferometric determination of an object topography.

BACKGROUND

Interferometry, e.g., scanning white light interferometry (SWLI), may be used to determine a spatial property of an object. Typical spatial properties include a surface topography or location of the object with respect to some reference. For objects including a thick film overlying an opaque substrate, the SWLI data may include two spaced part interference patterns resulting, respectively, from the substrate-film interface and film-air interface. If the interference patterns are entirely separable, i.e., if there is a region of zero modulation between the two signals, then the data can provide independent information about the substrate surface and film-air interface using standard techniques. As the overlying film becomes thinner, the respective interference patterns begin to overlap and distort one another. Such overlapped interference patterns can provide erroneous spatial information regarding the substrate surface and film-air interface.

SUMMARY

One aspect of the invention relates to methods and systems for analyzing low coherence interference signals from objects producing interference patterns that overlap as a function of optical path length difference (OPD). Methods and systems of the invention may be used in, e.g., flat panel display measurements, semiconductor wafer metrology, solder bump processing, in situ thin film measurements, and dissimilar materials analysis.

One exemplary method relates to the rapid determination of a spatial property of a photoresist film over a patterned wafer for in-situ focus and tilt adjustments with respect to a photolithography system. The spatial property can include a topography and/or a position of a top surface of the photoresist with respect to a reference of the photolithography system. In some embodiments, the spatial property is indicative of an absolute or relative position of the photoresist film, e.g., with respect to the photolithography system.

In general, in one aspect, the invention features a method including: (i) obtaining a low coherence interference signal from a measurement object, the measurement object including first and second interfaces, the low coherence interference signal including first and second overlapping interference patterns respectively resulting from the first and second interfaces; and (ii) identifying a subset of the overlapping interference patterns, the subset having a greater contribution from one of the first and second interference patterns than the other interference pattern.

Embodiments of the method may include any of the following features.

The obtaining may include obtaining a plurality of low coherence interference signals, each low coherence interference signal including first and second overlapping interference patterns, each first interference pattern resulting from a different point of the first interface, each second interference pattern resulting from a different point of the second interface, the obtaining a plurality of low coherence interference signals including imaging the object, and the identifying a subset includes identifying a subset of each of the interference signals, each subset having a greater contribution from one of the first and second interference patterns of the corresponding interference signal than the other interference pattern.

For each of the plurality of low coherence interference signals, the obtaining may include using an interferometer, each of the plurality of low coherence signals resulting from light have a range of optical path length differences, each range of optical path length differences being at least 50% of a coherence length of the interferometer. For example, each range may be at least as great as the coherence length of the interferometer.

The first interface may be an outer surface of the object and the method may include determining a relative height of each of a plurality of the points of the outer surface.

The first and second interfaces may be separated by 1000 nm or less.

The first interface may be an outer surface of the object and the second interface is beneath the outer surface. For example, the outer surface may be an outer surface of a layer of photoresist overlying a substrate and the second interface is defined between the outer surface of the photoresist and the substrate.

The first and second interfaces may be interfaces of a liquid crystal display cell.

The method may further include determining a spatial property of each of at least some of the points of the first or second interfaces based on the low coherence interference signals.

Each of the first and second overlapping interference patterns may include a plurality of fringes and the determining a spatial property of each of at least some of the points may include determining the spatial property of each of at least some of the points based on less than one-half of the fringes one of the first or second overlapping interference patterns.

Each of the first and second overlapping interference patterns may include a plurality of fringes and the determining a spatial property of each of at least some of the points may include transforming the one-half of the fringes of each first or second overlapping interference pattern.

The determining a spatial property of each of at least some of the points may include determining the spatial property of each of the at least some points based on an asymmetric subset of the overlapping interference patterns of the corresponding interference signal. For example, the determining a spatial property of each of at least some of the points may include transforming the asymmetric subset. Also, the first interface may be an outer surface of the object and the determining a spatial property of each of at least some of the points may include determining a spatial property of a plurality of points of the outer surface. In such cases, each asymmetric subset may be dominated by interference resulting from the outer surface of the object.

The identifying a subset may include determining a boundary of the asymmetric subset based on a template indicative of an interferometer response. For example, the template may be indicative of an object-height independent interferometer response. The determining a boundary may includes comparing the template and the low coherence interference signal.

The identifying a subset may include cross-correlating a template indicative of an interferometer response and the low coherence interference signal. The cross-correlating may include normalizing based on a shape of the low coherence interference signal.

The determining a spatial property of each of at least some of the points may include determining the spatial property based on the corresponding low coherence interference signal and a template indicative of an interferometer response. The determining a spatial property of each of at least some of the points may father include comparing the corresponding low coherence interference signal and the template. The comparing may include determining a location of best match between the corresponding low coherence interference signal and the template. For example, the comparing may include cross-correlating the template and the overlapping interference patterns. The cross-correlating may include normalizing based on a shape of the corresponding low coherence interference signal.

The template may be asymmetric. For example, template may have a shape of a truncated interference pattern. The method may further include generating the template by obtaining a reference low coherence interference signal from each of a plurality of points of a reference object, wherein the template includes contributions derived from each of the reference low coherence interference signals.

For example, each reference low coherence interference signal may include object-height dependent properties indicative of a height of the corresponding object point, and preparing the template may include removing object-height dependent properties from the reference low coherence interference signals. The reference low coherence interference signals may include a non-overlapping interference pattern.

In another aspect, the invention features an apparatus, including: (i) an optical system configured to obtain a low coherence interference signal from an object, the object having a plurality of interfaces, wherein the low coherence interference signal includes at least first and second overlapping interference patterns resulting from at least first and second interfaces of the object; and (ii) a processor configured to determine a spatial property of at least one of the first and second interfaces based on an asymmetric subset of the first and second overlapping interference patterns.

Embodiments of the apparatus may include any of the following features.

The processor may further configured to determine a portion of the low coherence interference signal including greater contributions from one of the first and second interference patterns as opposed to the other of the interference patterns, and select the subset of data from the portion of the low coherence interference signal.

The first interface may be an outer surface of the object and the first interference pattern results from the first interface, and the processor may be further configured to determine a spatial property of the first interface.

The optical system may be configured to obtain a plurality of low coherence interference signals from the object, each low coherence interference signal including respective first and second overlapping interference patterns resulting from different points of the first and second interfaces, and wherein the processor may be further configured to determine a spatial property of a plurality of points of the first interface based on respective asymmetric subsets of the plurality of low coherence interference signals.

For example, the spatial property of the plurality of points may be a relative height of each of the points.

The processor may be configured to determine a spatial property of the outer surface of the object with respect to another object.

The processor may be configured to determine a position of the outer surface of the object relative to a photolithography apparatus.

The processor may be further configured to carry out any of the steps described above with respect to the first-mentioned method aspect of the invention.

In general, in another aspect, the invention features a processor configured to at least: receive a low coherence interference signal obtained from an object using an interferometer, the object having a plurality of interfaces, wherein the low coherence interference signal includes at least first and second overlapping interference patterns resulting from at least first and second interfaces of the object; and determine a spatial property of at least one of the first and second interfaces based on an asymmetric subset of the first and second overlapping interference patterns. Embodiments of the processor may further include features described above with respect to the first-mentioned method aspect of the invention.

In general, in another aspect, the invention features a method for determining a spatial property of an object, the method including: (i) providing a low coherence interference signal obtained from a first object using an interferometer; and (ii) determining a spatial property of the first object based upon the low coherence interference signal and a template indicative of a response of the interferometer.

Embodiments of the method may include any of the following features The first object may include an outer surface and the determining may include determining a relative height of a point of the outer surface.

The providing may include providing a plurality of low coherence interference signals each obtained from a corresponding different point of the first object using the interferometer; and the determining may include determining a spatial property of each of the different points based upon the corresponding low coherence interference signal and the template.

The plurality of low coherence interference signals may be each obtained by steps including imaging a portion of the object using the interferometer.

The object may have an outer surface and the spatial property of each of the different points is a height of each point. For example, the object may include a wafer coated with photoresist and the outer surface of the object may be an outer surface of the photoresist.

The template may be asymmetric. For example, the template may have a shape of a truncated interference pattern. The low coherence interference signal may include overlapping interference patterns resulting from first and second interfaces of the object and the determining a spatial property may include determining a spatial property of at least one of the first and second interfaces. The first interface may be an outer surface of the object and the determining may include determining a spatial property of the outer surface. Furthermore, a shape of the template may corresponds to a portion of the low coherence interference signal dominated by contributions from the first interface as opposed to the second interface.

The template may include contributions derived from each of a plurality of second low coherence interference signals. For example, each of the plurality of second low coherence interference signals may result from a respective, different point of a reference object.

Each of the plurality of second low coherence interference signals may include object-height dependent properties indicative of a height of the corresponding reference object point, and wherein the method includes generating the template, and the generating the template may include removing contributions from the object-height dependent properties. For example, each second low coherence interference signal may have a phase-related property indicative of the height of the corresponding reference object point and the removing contributions may include removing the phase-related property. Also, the first object and the reference object may be the same. Alternatively, the first object may include a substrate including an overlying thin film and the plurality of second low coherence interference signals may be obtained from a portion of the reference object having a single reflective interface.

The method may further including comparing the template and the low coherence interference signal.

The comparing may include cross-correlating the template and the low coherence interference signal. For example, the cross-correlation may include a partially complex cross-correlation. The cross-correlating may include normalizing based upon a shape of the low coherence interference signal.

The comparing may include determining a location within the low coherence interference signal and the determining a spatial property may include processing a portion of the low coherence interference signal located to one side of the location. Furthermore, the method may also include transforming the low coherence interference signal. For example, the low coherence interference signal may include first and second overlapping interference patterns and the portion of the low coherence interference signal to the one side of the location may be dominated by contributions from the first interference pattern as opposed to the second interference pattern. For example, the first interference pattern may result from an outer surface of the first object.

In general, in another aspect, the invention features a method for preparing an interferometer template, including: providing a plurality of low coherence interference signals, each low coherence interference signal having been obtained from a corresponding different point of an object using an interferometer; and generating a template indicative of a response of the interferometer, the generating including combining contributions from each of the low coherence interference signals.

Embodiments of the method may include any of the following features.

Each low coherence interference signal may have been obtained from the corresponding different point of the object by imaging a portion of the object using an interferometer.

Each of the different points of the object may have a respective spatial property and each low coherence interference signal may include a spatial dependent property dependent on the spatial property of the corresponding object point and the generating the template may include removing the spatial dependent property of at least some of the low coherence interference signals.

The spatial property may be a relative height.

The removing the spatial dependent property may include: transforming the low coherence interference signals to an inverse dimension, the transformed low coherence interference signals exhibiting a phase change along the inverse dimension; and removing a linear portion of the phase change with respect to the inverse dimension.

The different points of the object may be different points about an interface of the object.

The interface may be an outer surface of the object.

The method may further include: obtaining, with the interferometer, at least one second low coherence interference signal, the second low coherence interference signal resulting from a point of a second object; and determining a spatial property of the point of the second object based on the second low coherence interference signal and the template.

For example, the second object may include a substrate and at least one overlying layer, the point of the second object defined by at least a portion of the overlying layer.

The overlying layer may have a surface that defines an outer surface of the object, the point of the second object being located at the outer surface.

The obtaining, with the interferometer, may include obtaining a plurality of second low coherence interference signals, each second low coherence interference signal resulting from a different point of the second object and the determining a spatial property of the point of the second object may include determining a spatial property of the different points of the second object based on the second low coherence interference signals and the template.

The obtaining a plurality of second low coherence interference signals may include imaging a portion of the second object.

The determining may include comparing the second low coherence interference signal and the template. For example, the comparing may include cross-correlating the at least one second low coherence interference signal and the template. Furthermore, the comparing may include normalizing the cross-correlation with respect to a shape of the first low coherence interference signals.

The template may have the form of an asymmetric truncated low coherence interference signal.

In general, in another aspect, the invention features a method for generating an interferometer template, including: providing at least one low coherence interference signal, the low coherence interference signal including an interference pattern resulting from at least one point of an object and having been obtained using an interferometer; and generating, from the at least one low coherence interference signal, an asymmetric template indicative of a response of the interferometer.

Embodiments of the method may include any of the following features.

The asymmetric template may have a shape of a truncated interference pattern.

The at least one point of the object may have a spatial property and the at least one low coherence interference signal may have a spatial dependent property dependent on the spatial property of the at least one point, and wherein the generating may include removing the spatial dependent property from the low coherence interference signal.

In general, in another aspect, the invention features a method, including: providing a low coherence interference signal obtained from an object; and determining a spatial property of the object based on a comparison of the low coherence interference signal and a template, the template having a shape of a truncated interference pattern.

Embodiments of the method may include any of the following embodiments.

The providing may include providing a plurality of low coherence interference signals, each obtained from a corresponding different point of the object; and the determining a spatial property may include determining a spatial property of each of the different points of the object based on a comparison of the corresponding low coherence interference signal and the template.

The method may further include comparing the low coherence interference signal and the template by cross-correlating the low coherence interference signal and the template.

The object may further include a substrate and at least one overlying layer and the spatial property of the object is a spatial property of at least a point of an outer surface of the overlying layer.

The low coherence interference signal may have been obtained by a method including reflecting light from the outer surface of the overlying layer. For example, the overlying layer may be a photoresist.

In general, in another aspect, the invention features an interferometer, including: an optical system configured to obtain a plurality of low coherence interference signals from different points of an object; and a processor including code. The processor configured to prepare a template indicative of a response of the interferometer, the template including contributions from the plurality of low coherence interference signals.

Embodiments of the apparatus may include any of the following features.

The plurality of low coherence interference signals may include properties related to spatial properties of the different points of the object; and the code configured to prepare a template, may include code configured to prepare a template lacking at least some of the properties related to spatial properties of the different points of the object.

The processor including code is further configured to: obtain a second low coherence interference signal from a second object; and determine a spatial property of the second object based on the second low coherence interference signal and the template. For example, the code to determine a spatial property may include code configured to compare the second low coherence interference signal and the template.

The processor may be further configured to carry out any of the corresponding steps described above in connection with the above-described method aspects.

In general, in another aspect, the invention features a processor including computer readable medium, the medium including code configured to cause the processor to: receive a plurality of low coherence interference signals obtained from different points of an object using an interferometer; and generate a template indicative of a response of the interferometer, the template including contributions from the plurality of low coherence interference signals.

In further embodiments, the code may further cause the processor to carry out nay of the corresponding steps described above in connection with the above-described method aspects.

An embodiment of system for obtaining interferometry data includes a low-coherence (spectrally broadband and/or extended source) interferometer, e.g. a scanning white light interferometry (SWLI) instrument, equipped to mechanically or electro-optically scan at least an element of the system so as to change an optical path difference (OPD) between a reference and measurement path, the measurement path being directed to an object surface. A processor records a plurality of interference signals during the OPD scan, such as by imaging a portion of the object onto a plurality of detector elements. By virtue of the low coherence source and/or geometry of the apparatus, the interference signal is localized about the zero OPD position for each imaged point of the object surface. The system is configured to analyze objects that may have multiple layers, in particular a transparent thin film on a substrate, for which the interference signals from the interfaces between layers are not entirely separated.

A method of the invention includes selecting a portion of the interference signal of detected by each detector element. The selected portion corresponds to a selected interface or surface, e.g., an interface between a substrate and thin film layer. The selected portion of each interference signal is identified as being the relatively undistorted by unwanted interference phenomena resulting from reflections from the other interfaces or surfaces. The selected portion may include or be limited to interference information acquired for OPD positions different from the zero OPD for the interface of interest.

An inventive method for selecting portions of interference signals includes extracting a portion of the interference signal starting at a particular optical path length difference identified e.g. by the signal centroid or some other characteristic of the signal that predictably defines the limits of the substantially uncorrupted portion of the signal of interest. The extracted portion is then sent for further processing as if it were the total signal.

Another inventive method for selecting portions of low coherence interference signals includes comparing measurement interference signals acquired from a measurement object and template generated by prior measurement of a reference surface, by using the measurement interference signals themselves, by theoretical prediction or combination thereof. The template can correspond to a portion of each low coherence interference signal that is substantially undistorted. The method can include finding the location of each measurement low coherence interference signal that best matches the template. This technique can provide the interface height location directly, without further processing. As an improvement to the measurement resolution, the technique may include more than one stored signal, for example a set of templates with various offsets, so as to allow for improved interpolation.

As a step in the data processing, once the location of the interface has been identified according to the location of the selected signal portion with respect to optical path length difference, compensating factors may be included so as to account for refractive and dispersive properties of thin films and how these material parameters relate e.g. to the NA of the objective and spectral bandwidth of the illumination, so as to provide corrected data corresponding to the true physical profile of the interface of interest.

In some embodiments, a spatial property of an outer surface of photoresist is determined based on at least a portion of an interference signal including overlapping interference patterns. A relative position of the photoresist and a photolithography system can be modified based on the spatial property.

In some embodiments, a spatial property of an outer surface of an object is determined from at least a portion of a low coherence interference, e.g., after removing some material from the outer surface. Based on the spatial property, additional material can be removed. For example, a rate of removal can be modified during the additional removal.

In some embodiments, a spatial property of a portion of an object is determined, e.g., after irradiating the portion of the object with a laser beam to form a scribe line. Additional scribing of the object or another object is performed based on the spatial property.

In some embodiments, a plurality of low coherence interference signals is obtained. Each interference signal includes detector intensity as a function of optical path length difference values and can be designated as $I_{sys}$. The plurality of interference signals are averaged in the frequency domain to determine a single, partial spectrum $\tilde{q}_{sys}$ corresponding to the field average over all the low coherence interference signals in the frequency domain.

The partial spectrum is inverse transformed to provide a template $\tilde{I}_{sys}$, the real part of which may represent interference signals similar to each interference signal, but with amplitude scaling and object height dependent differences removed. In some embodiments, the template is retained in a complex form $\tilde{I}_{sys}$ such that the envelope and phase at each scan position $\zeta$ can be separated using the modulus and argument, respectively, of the complex function $\tilde{I}_{sys}$.

Unless otherwise defined, all technical and scientific terms used herein have the same meaning as commonly understood by one of ordinary skill in the art to which this invention belongs.

Unless otherwise stated, spatial properties of objects determined by methods and systems discussed herein may be relative or absolute.

Other features, objects, and advantages of the invention will be apparent from the following detailed description.

BRIEF DESCRIPTION OF THE DRAWINGS

FIG. 10b is a top view of the object of FIG. 1a.

FIGS. 11a and 11b show the structure before and after planarization, respectively.

FIG. 12a shows the structure before addition of solder. FIG. 12b shows the structure after addition of solder but prior to flowing the solder.

FIG. 20a illustrates a positive-frequency portion of the magnitude spectrum of the Fourier transform of the interference signal of FIG. 19.

FIG. 20b illustrates template transformed interferometry data and is a positive-frequency portion of a field-averaged spectrum $\tilde{q}_{sys}$ including contributions from a plurality of interference signals according to FIG. 19.

DETAILED DESCRIPTION

Figure 1:
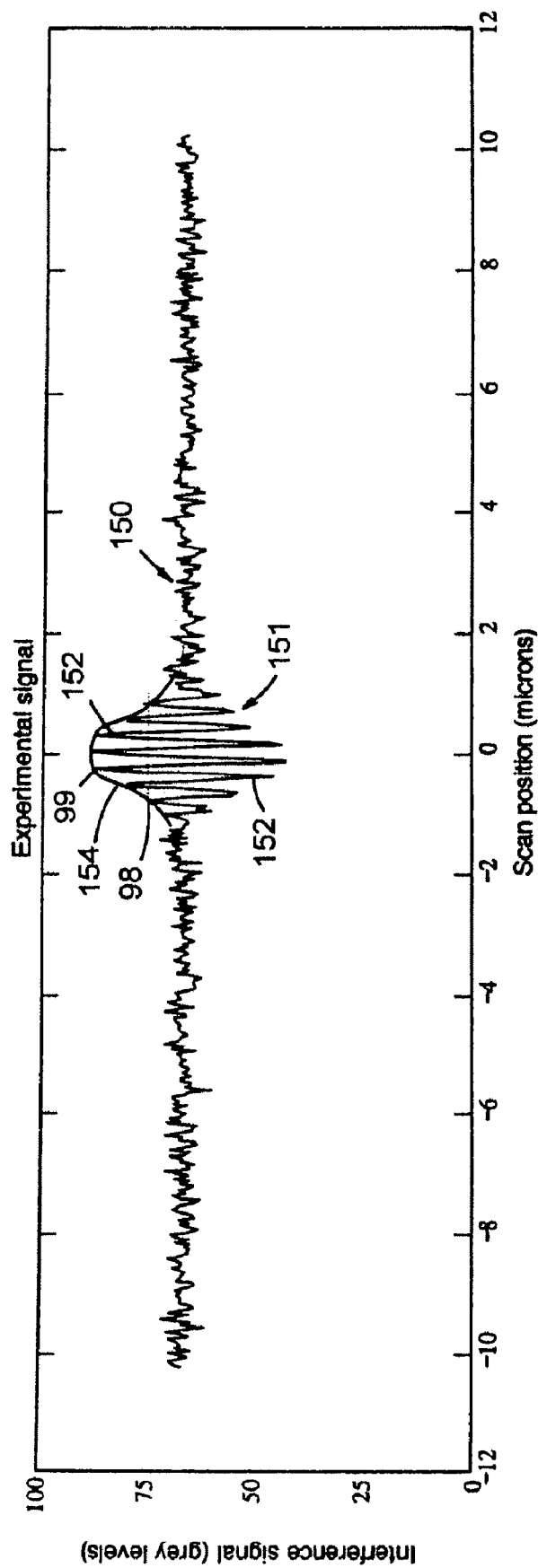
FIG. 1 is a low-coherence interference signal from a solid silicon substrate without a thin film or other coating. The scan position is the $\zeta$ coordinate.

Referring to FIG. 1, a simulated low coherence interference signal 150 includes a plurality of detector intensity values obtained from a single point of an object, e.g., a point of a silicon wafer having a single reflective interface. The intensity values are plotted as a function of an optical path length difference (OPD) between light reflected from the object point and light reflected from a reference object. Interference signal 150 is a low coherence scanning white light interferometry (SWLI) signal obtained by scanning the OPD, e.g., by moving an optic and/or the object to vary the optical path traveled by the light reflecting from the object or the reference light. A Mirau interferometer is an example of an interferometer that can be configured as a low coherence scanning white light interferometer. An interferometer may, alternatively or in combination, vary the OPD by detecting a spatial distribution of light reflected from the object and the reference light with the OPD varying as a function of spatial position on a detector.

In FIG. 1, the intensity values are plotted as a function of OPD (here scan position) and map out an interference pattern 151 having a plurality of fringes 152, which decay on either side of a maximum according to a low coherence envelope 154. In the absence of a low coherence envelope, the fringes of an interference pattern typically have similar amplitudes over a wide range of optical path differences. The envelope 154 itself does not expressly appear in such interference signals but is shown for discussion. The location of the interference pattern along the OPD axis is generally related to a position of zero OPD, e.g., a scan position or spatial position corresponding to zero OPD between light reflected from the object point and from a reference object. The zero OPD scan position is a function of the object topography, which describes the relative height of each object point, and the orientation and position of the object itself, which influences the position of each object point with respect to the interferometer. The interference signal also includes instrumental contributions related to, e.g., the interferometer optics, e.g., the numerical aperture (NA) of the optics, the data acquisition rate, the scan speed, the wavelengths of light used to acquire the interference signal, the detector sensitivity as a function of wavelength, and other instrumental properties.

The width of the coherence envelope 154 that modulates the amplitudes of fringes 152 corresponds generally to the coherence length of the detected light. Among the factors that determine the coherence length are temporal coherence phenomena related to, e.g., the spectral bandwidth of the source, and spatial coherence phenomena related to, e.g., the range of angles of incidence of light illuminating the object. Typically, the coherence length decreases as: (a) the spectral bandwidth of the source increases and/or (b) the range of angles of incidence increases. Depending upon the configuration of an interferometer used to acquire the data, one or the other of these coherence phenomena may dominate or they may both contribute substantially to the overall coherence length. The coherence length of an interferometer can be determined by obtaining an interference signal from an object having a single reflecting surface, e.g., not a thin film structure. The coherence length corresponds to the full width half maximum of the envelope modulating the observed interference pattern.

As can be seen from FIG. 1, interference signal 150 results from detecting light having a range of optical path differences that varies by more than the width of the coherence envelope and, therefore, by more than the coherence length of the detected light. In general, a low coherence interference signal can result from obtaining interference fringes that are amplitude modulated by the coherence envelope of the detected light. For example, the interference pattern may be obtained over an OPD for which the amplitude of the observed interference fringes differs by at least 20%, at least 30% or at least 50% relative to one another. For example, fringe 98 has a peak amplitude that is about 50% less than a peak amplitude of a fringe 99.

A low coherence interferometer can be configured to detect an interference signal is detected over a range of OPD's that is comparable to or greater than the coherence length of the interferometer. For example, the range of detected OPD's may be at least 2 times greater or at least 3 times greater than the coherence length. In some embodiments, the coherence length of the detected light is on the order of the height variations of features of the object, e.g., on the order of a couple of microns or less but more than a nominal wavelength of the detected light.

In general, instrument related contributions to the interference signal, e.g., to the shape and phase of the interference patterns, tend to vary slowly with the topography and position of the object. On the other hand, interference patterns shift along the scan position axis for interference signals obtained from object points having different spatial properties, e.g., different relative heights or different relative positions with respect to the interferometer. Accordingly, interference patterns obtained from different object points may have similar shapes but are shifted along the scan position axis by an amount related to the spatial properties of each point.

Figure 2:
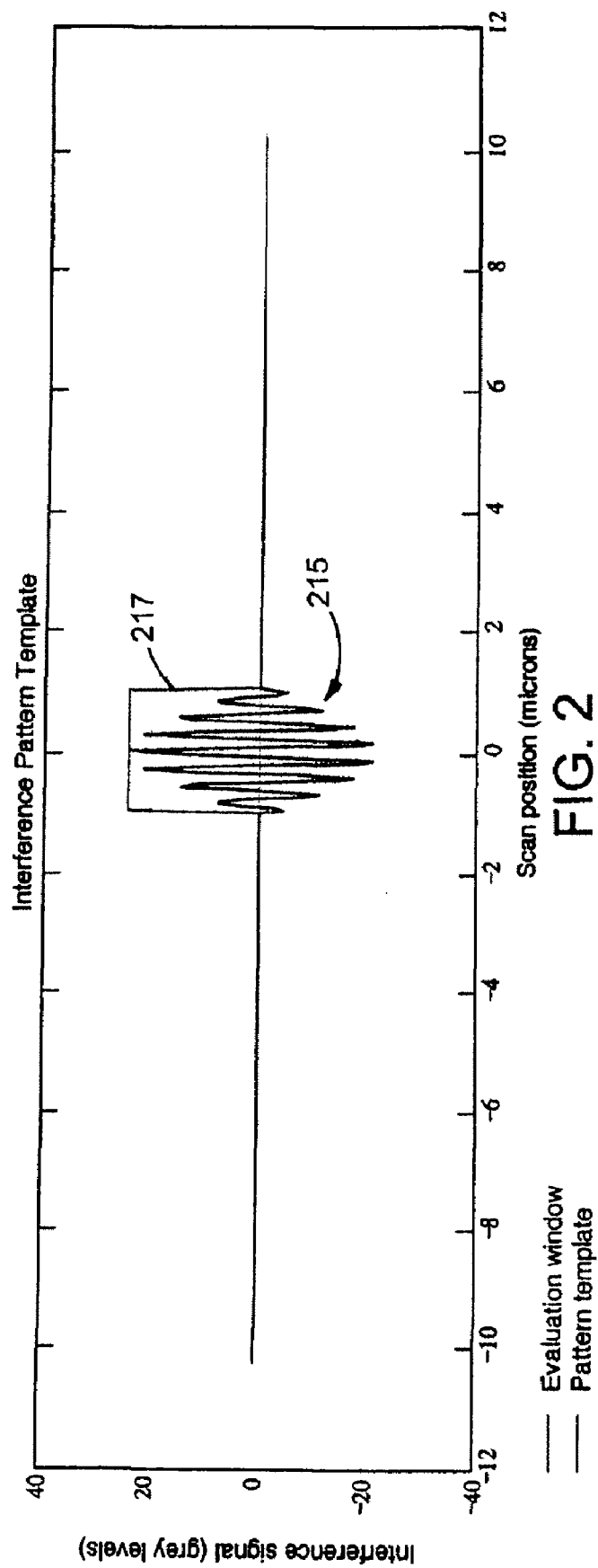
FIG. 2 is a template including contributions from interference signals obtained from each of a plurality of different locations of the silicon substrate referring to in the description of FIG. 1. The template of FIG. 2 has been multiplied by a window function, which is also shown.

With reference to FIG. 2, a template 215 has reduced or eliminated contributions related to spatial properties of the object and object points, e.g., object topography (which describes the relative heights of different points), object position, and object orientation contributions. Template 215 is representative of the response of an interferometer to an object and can include instrumental contributions representative of those appearing in low coherence interference signals obtained using the interferometer. As discussed above, such instrument contributions are similar or the same for interference signals obtained from different objection points. Hence, template 215 can include contributions from interference signals obtained from different object points. The different points may be arranged about an entire surface to be analyzed or about one or more subsets of an area to be analyzed.

Interference signals from different object points are processed to combine, e.g., average, information from a plurality of interference signals to prepare the template. The resulting template can have a significantly higher signal-to-noise level (S/N) than individual interference signals. In some embodiments, template 215 includes contributions from a plurality of interference signals and has a S/N that is at least 10, at least 33, or at least 100 times greater than the individual interference signals. Applicants have found that interference signals can be processed based on such a template to determine one or more spatial properties of an object.

Figure 3:
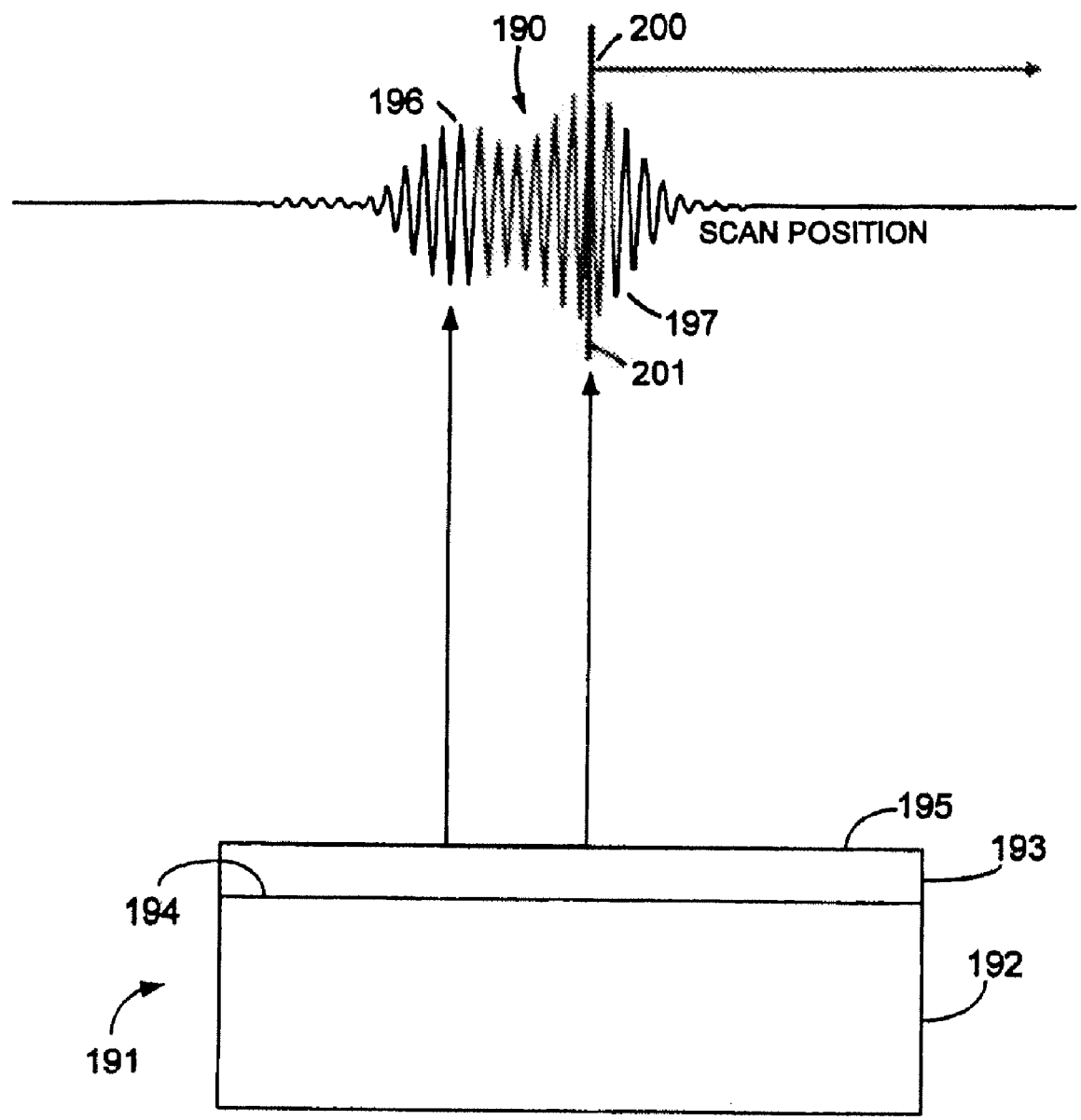
FIG. 3 illustrates overlapping interference patterns obtained from an object having a substrate and an overlying thin film.

Referring to FIG. 3, an interference signal 190 is acquired from an object 191, which includes a substrate 192 and an overlying layer, e.g., a thin film 193. The substrate and film define an interface 194 therebetween. An outer surface of the film 195 defines an interface between the object and its surroundings, e.g., the air, other gas, or vacuum. Interfaces are generally defined by a change in refractive index between portions of an object.

Interference signal 190 includes a first interference pattern 196 resulting from interface 194 and a second interference pattern 197 resulting from interface 195. First and second interference patterns 196,197 are overlapping. For example, maxima of the interference patterns 196,197 are separated by an OPD less than the coherence length of the interferometer and patterns 196,197 are not separated by a region of zero intensity. Existing methods for determining spatial properties of an object with interfaces that produce overlapping interference patterns can yield erroneous results because the overlapping interference patterns distort one another. Applicants have found that spatial properties of an object with such interfaces can be determined based upon a portion over the overlapping interference patterns. For example, a spatial property of interface 195, e.g., a topography of the outer surface of object 191, can be determined based upon a subset 200 of interference signal 190. Subset 200 is dominated by contributions from interference pattern 197 (from interface 195) as opposed to contributions from interference pattern 196 (from interface 194). A spatial property of interface 194 can be determined based upon a subset similar to subset 200 but located toward the left of the overlapping patterns.

Figure 4:
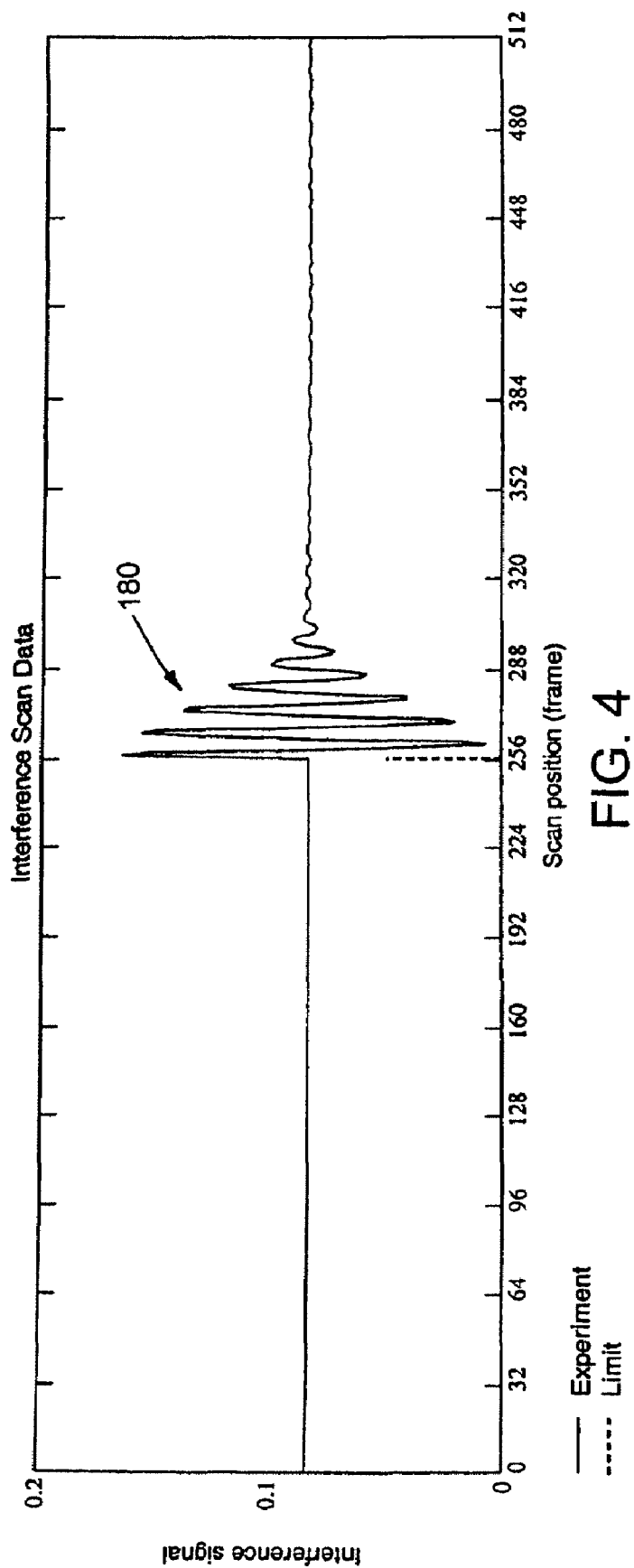
FIG. 4 is an asymmetric template.

Referring to FIG. 4, a template 180 is asymmetric, having a shape of a truncated interference pattern, A spatial property of an object having one or more interfaces, e.g., a spatial property of interface 195 of object 190, can be determined based on an asymmetric template 180. In some embodiments, an interference signal can be processed with an asymmetric template to determine a boundary of a subset of the interference signal that can be processed to determine a spatial property of an interface. For example, interference signal 200 (FIG. 3) can be processed with template 180 (FIG. 4) to determine a boundary 201 of subset 200 with interference signal 190 (FIG. 3). The boundary is typically a position along the x-axis of the interference signal, e.g., a scan position. The subset can be selected based on the boundary. The subset can be subjected to further processing to determine a spatial property of a particular interface. In some embodiments, an interference signal can be processed with an asymmetric template to determine a spatial property of an interface of an object without further processing.

Low coherence interference signals resulting from objects without thin films and from objects without thin films are now discussed in greater detail.

Referring back to FIG. 1, low coherence interference signal 150 simulates data acquired using a light source having a Gaussian distribution in wavenumbers with a 100 nm bandwidth in wavelength centered about an average of 640-nm, an objective numerical aperture (NA) of 0.3, and a measurement object made of solid silicon nitride ($Si_3N_4$, index=2.019), which material is partially transparent at 640 nm.

Figure 5:
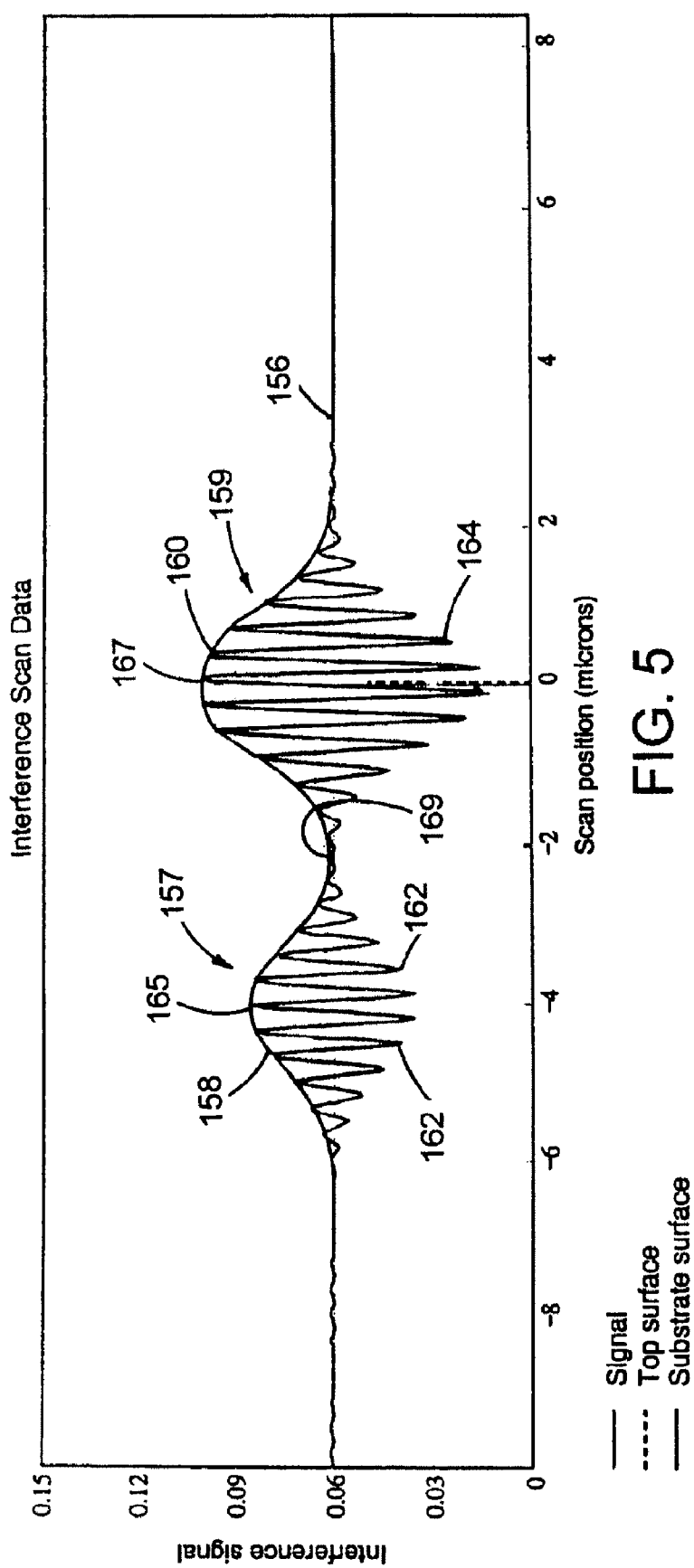
FIG. 5 is a low-coherence interference signal from a (silicon) substrate with a 2-μm coating of $Si_3N_4$.

Referring now to FIG. 5, a low coherence interference signal 156 simulates data acquired from a measurement object having a silicon (Si, index=3.725-0.029i) substrate coated with 2 μm of $Si_3N_4$. For clarity, interference signal 156 is simulated without noise. Signal 156 includes a first interference pattern 157 and a second interference pattern 159. First and second interference patterns 157,159 respectively include peaks 165,167 and fringes 162,164, which decay in accordance with respective envelopes 158,160. The peaks of the interference patterns are spaced apart along the scan position axis. Interference patterns 157,159 respectively correspond to interference resulting from reflections from the substrate-film interface and the film-air interface of the measurement object. Interference patterns 157,159 do not overlap, e.g., the patterns are spaced apart by a region 169 of essentially zero modulation intensity. Accordingly, interference signals 157,159 can be processed independently of one another to determine spatial properties of the object interfaces.

Figure 6:
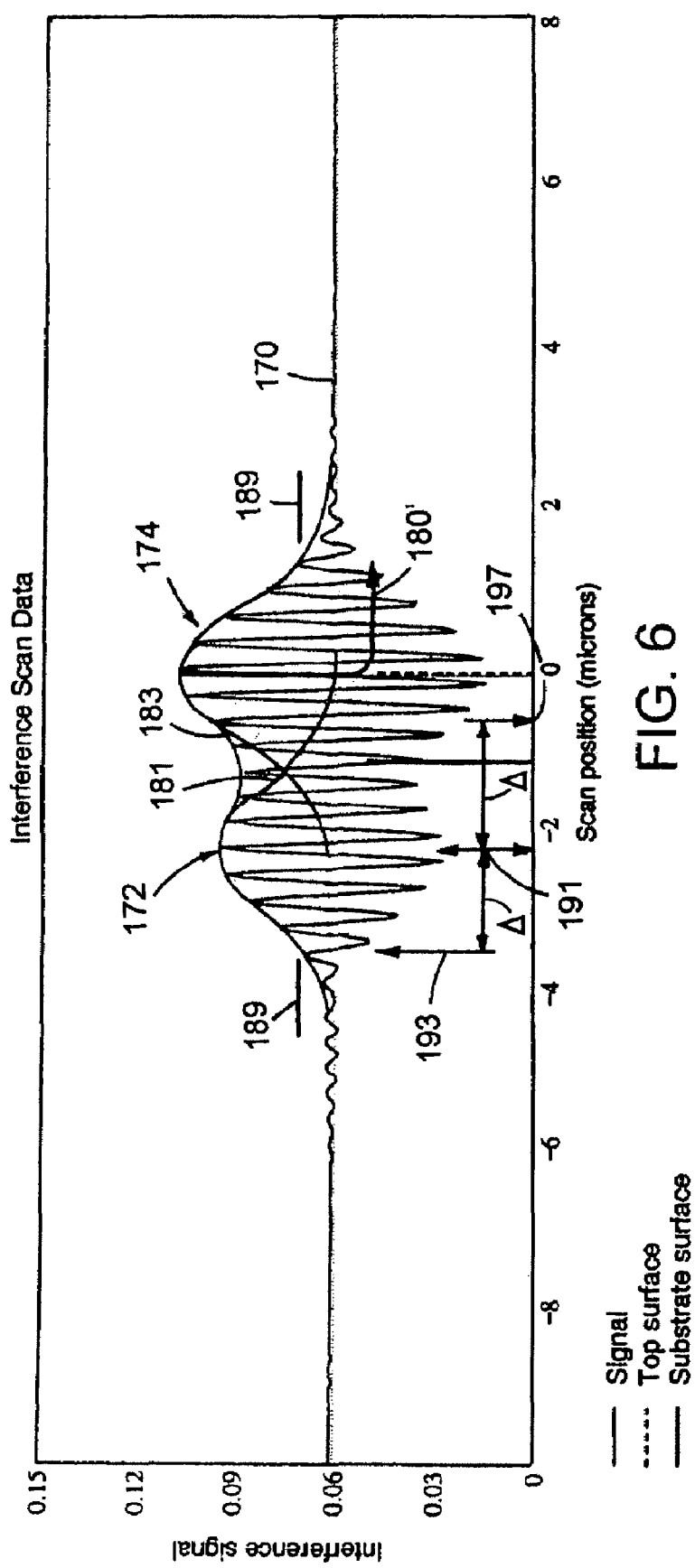
FIG. 6 is a low-coherence interference signal from a (silicon) substrate with a 1.1-μm coating of $Si_3N_4$.

Referring to FIG. 6, a low coherence interference signal 170 simulates data acquired from an object having a silicon (Si, index=3.725-0.029i) substrate coated with a 1.1 μm thick $Si_3N_4$ thin film. The interference signal includes a first interference pattern 172 (resulting from the interface at the silicon substrate) and a second interference pattern 174 (resulting from the outer surface of the $Si_3N_4$ layer) each pattern including a plurality of fringes, which decay in accordance with respective envelopes 181,183. Because of the reduced film thickness (as compared to FIG. 5), the interference patterns 172,174 overlap creating a total interference pattern. Conventional data processing would be unable to distinguish between the combined interference effects and would provide an erroneous interface spatial property, e.g., an incorrect film height, topography, or position.

Figure 7:
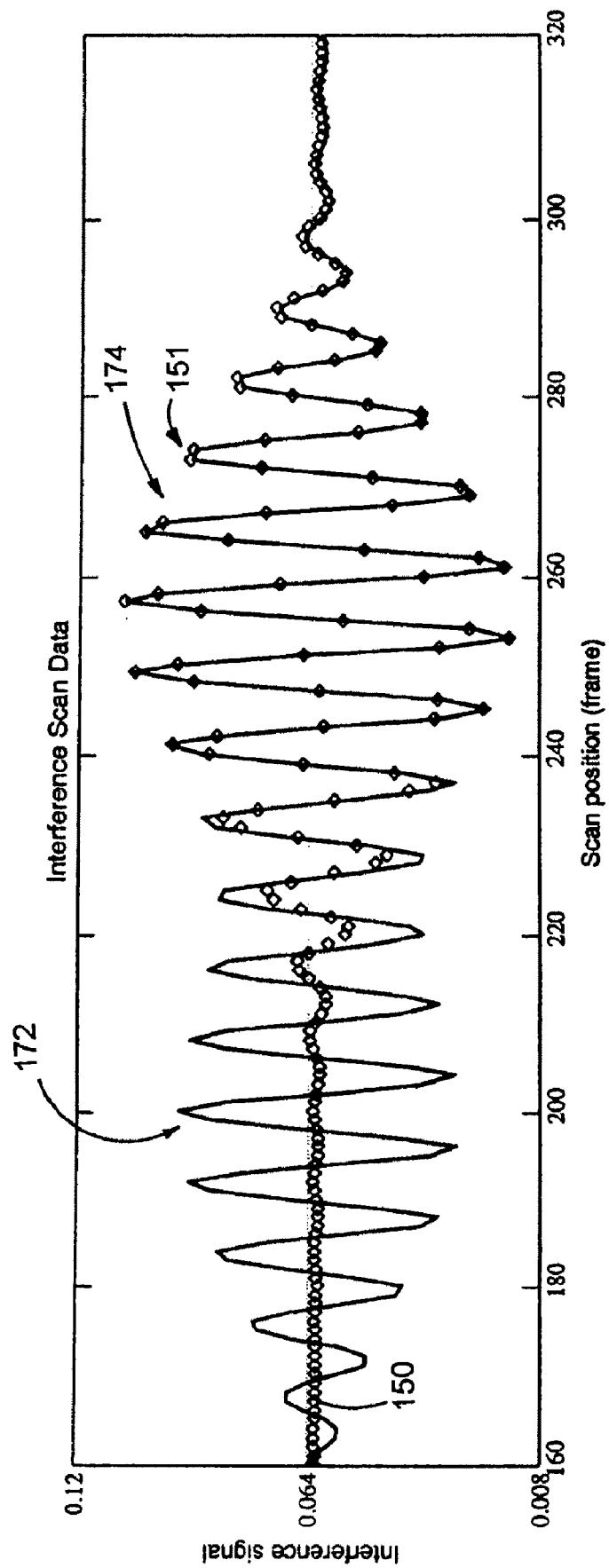
FIG. 7 is an expanded view of a direct comparison of the plot in FIG. 3 (diamonds) and the plot in FIG. 6 (solid line).

Referring to FIG. 7, a portion of the interference signal 150 from FIG. 1 is plotted with a portion of interference signal 170 of FIG. 6 including interference patterns 172 and 174. (Here, for clarity, the interference pattern of interference signal 150 is shown as discrete points rather than as points connected to form a line as in FIG. 1. Each point represents a detector intensity observed at a particular scan position.) Although the presence of the 1.1 μm film alters interference signal 170 as compared to interference signal 150, portions of interference pattern 174 (film-air interface) and interference pattern 151 (resulting from a substrate-air interface) are nearly identical.

In some embodiments discussed herein, a spatial property of a selected portion of an object including a substrate having one or more layers, e.g., thin films, is determined based on a subset of an interference signal. Although interference signals obtained from such objects may include overlapped interference patterns, the signals can include a subset that is relatively undistorted by the overlap. A relatively undistorted subset of an interference signal can be used to determine spatial properties of the measurement object. Typically, each subset includes at least a portion of an interference pattern dominated by interference resulting from the selected portion of the measurement object. For example, referring to FIG. 6, a subset 180' of interference signal 170 includes fringes dominated by contributions from interference resulting from the 1.1 μm thick $Si_3N_4$ thin film-air interface, as opposed to interference resulting from the underlying silicon-film interface, which appears at the left side of the interference signal. Subset 180' is asymmetric with respect to scan position. Properties of subset 180', including, e.g., the interference phase, correspond to the $Si_3N_4$ thin film-air interface with little or no influence from the underlying silicon-film interface.

A spatial property of the 1.1 μm thick $Si_3N_4$ thin film, e.g., a relative height of one or more points at its surface, can be determined based on subset 180'. In some embodiments, the determination gives little or no weight to portions of interference signal 170 outside subset 180'. For example, other portions of the interference signal can be suppressed, e.g., set to zero. Subset 180' can be analyzed to determine a spatial property of a portion of the film-air interface of the measurement object.

In some embodiments, subset 180' is asymmetric and contains 75% or less, 65% or less, or 50% or less of the area under the envelope that modulates the intensity of the interference pattern fringes. For example, subset 180' includes only about 50% of the area beneath envelope 183.

In some embodiments, at least 30%, at least 40%, at least 50%, or at least 75% of the subset is located to one side of a centroid of an interference pattern that would be observed in the absence of a second closely spaced interface or surface. For example, essentially all of subset 180' is located to the right of the centroid of interference pattern 151, which is observed in the absence of the film that results in the overlapping interference pattern 172 in FIG. 6.

In some embodiments, subset 180' includes fewer than all of the fringes of the interference signal. For example, referring to FIG. 6, interference signal 170 includes 16 fringes having an intensity at least as great as threshold intensity 189. Because the interference patterns of FIG. 4 are overlapped (unlike those of FIG. 3) the fringes of both interference patterns 172,174 contribute to the total. Subset 180' may include 50% or fewer of the fringes, 35% or fewer, 25% or fewer, 20% or fewer, or 15% or fewer of the fringes. The threshold intensity may be at least 2.5%, at least 5%, at least 10%, or at least 20% of a maximum fringe intensity. The threshold intensity may be 30% or less, e.g., 25% or less, 20% or less, or 15% or less of the maximum fringe intensity.

In some embodiments, a width of subset 180' is determined from an interference pattern adjacent to an interference pattern corresponding to a surface or interface to be analyzed. For example, interference pattern 172 results from the substrate-film interface (silicon-$Si_3N_4$) and interference pattern 174 results from the adjacent, overlying $Si_3N_4$-air interface. A dimension, e.g., a width Δ, of the adjacent interference pattern 172 can be determined from a peak 191 and a scan position, e.g., scan position 193, at which the amplitude of the adjacent interference pattern has decreased to a selected value, e.g., 25% of the peak, 15% or the peak, 10% of the peak, 5% of the peak, or 2% of the peak. The location of subset 180' is determined by excluding data of the interference signal that is located within Δ of peak 191, as by excluding data to the left of scan position 197.

Alternatively or additionally, a different subset of interference signal 170 (e.g., a subset derived from a portion of interference signal 170 located to the left in FIG. 6) could be subjected to analysis to determine a spatial property of the substrate-film interface of the measurement object.

In some embodiments, a subset of the interference pattern is subjected to FDA to determine a spatial property of the measurement object. In FDA embodiments, the subset can be transformed to an inverse dimension, e.g., by Fourier transformation. Typically, the analysis includes determining a rate of change of frequency domain phase with respect to frequency of the transformed signal. FDA techniques generally are discussed in U.S. Pat. No. 5,398,113 entitled "METHOD AND APPARATUS FOR SURFACE TOPOGRAPHY MEASUREMENTS BY SPATIAL-FREQUENCY ANALYSIS OF INTERFERENCE SIGNALS," the contents of which are incorporated herein by reference.)

In some embodiments, a subset of the interference pattern is analyzed directly in the optical path length difference domain, e.g., in the scan domain without transformation of the signal. Spatial information can be determined based on, e.g., the position of a portion of the subset, the spacing of fringes within the subset, or the phase of fringes of the subset relative to the fringes of a second interference signal.

In some embodiments, at least one template, as determined from theory, experiment, or combination thereof, is used to determine a position or boundary of subset 180' with respect to an interference signal and/or a spatial property of a portion of a selected portion of a measurement object, e.g., a topography or position of a substrate-film or film-air interface. The template may be symmetrical or may be asymmetric as is template 180. The template can provide a filter template for matching to a corresponding portion of a measurement interference signal that may include unwanted signals from more than one surface or interface. In the template approach, a matching or data correlation algorithm can be used to locate, with respect to scan position, a portion of the measurement interferometry data that corresponds to the interference resulting from the selected portion of the measurement object. The location with respect to scan position of the corresponding portion of the interferometry data is indicative of the spatial property of the selected portion of the measurement object. The template data may be derived from one or more reference objects, one or more measurement objects, or combination thereof.

In some embodiments, an interference signal is processed based on a template to determine a region of interest within the interference signal. For example, a template and an interference signal can be cross-correlated to determine a scan position that corresponds to a region of interest of the interference signal. The portion of the interference signal to one side of the boundary can be subjected to further processing, e.g. by frequency domain analysis (FDA) or in the optical path length dimension as discussed above.

In some embodiments, an interference signal is processed based on a template to determine a scan position that corresponds to a particular interface, such as the interface between a substrate-thin film or the interface between a thin film and the environment surrounding the object, e.g., a thin film-air interface. A photoresist-coated wafer is an example of an object with such interfaces. Once the region of interest has been identified, a portion of the interference signal can be subjected to further analysis, e.g., FDA or phase shifting to determine an object or object point spatial property, e.g., an object topography, position, or orientation. In some embodiments, the analyzed portion of the data is asymmetric and includes only a portion of the interference pattern resulting from a particular interface. The spatial property can be determined accurately even in the presence of nearby interfaces, e.g., interfaces separated by 1000 nm or less, 800 nm, or less, 600 nm or less, 500 nm, or less, e.g., 400 nm or less. In some embodiments, one or more spatial properties is determined accurately even in the presence of interfaces separated by 200 nm or more. For example, the height and position of one or more points of a thin film-air interface can be determined accurately even in the presence of the underlying substrate-film interface. In some embodiments, the distance between the two interfaces is on the order of the coherence length of the interferometer used to obtain the data, e.g., on the order of a few microns or less.

In some embodiments, an interference pattern is processed using the template to determine an object spatial property. For example, cross-correlation between the template and an interference signal can be used to determine the height or position of the object and/or one or more points thereof.

In some embodiments, the template is derived from a first object, e.g., a reference object without a thin film. One or more interference signals obtained from a second object, e.g., a measurement object with substrate-film and film-air interfaces, are processed based on the template. In some embodiments, a template derived from an object is used to process the interference signals derived from the same object.

In some embodiments, the spatial property is related to a topography of the measurement object, e.g., a height, position, or thickness of a layer covering a substrate. The spatial property may be related to a position and/or orientation of a portion of the measurement object, such as a position of a portion of the measurement object relative to another object, e.g., a position of a surface of a layer covering a substrate with respect to a reference portion of a photolithography tool.

Obtaining Interference Signals from an Object

Figure 9:
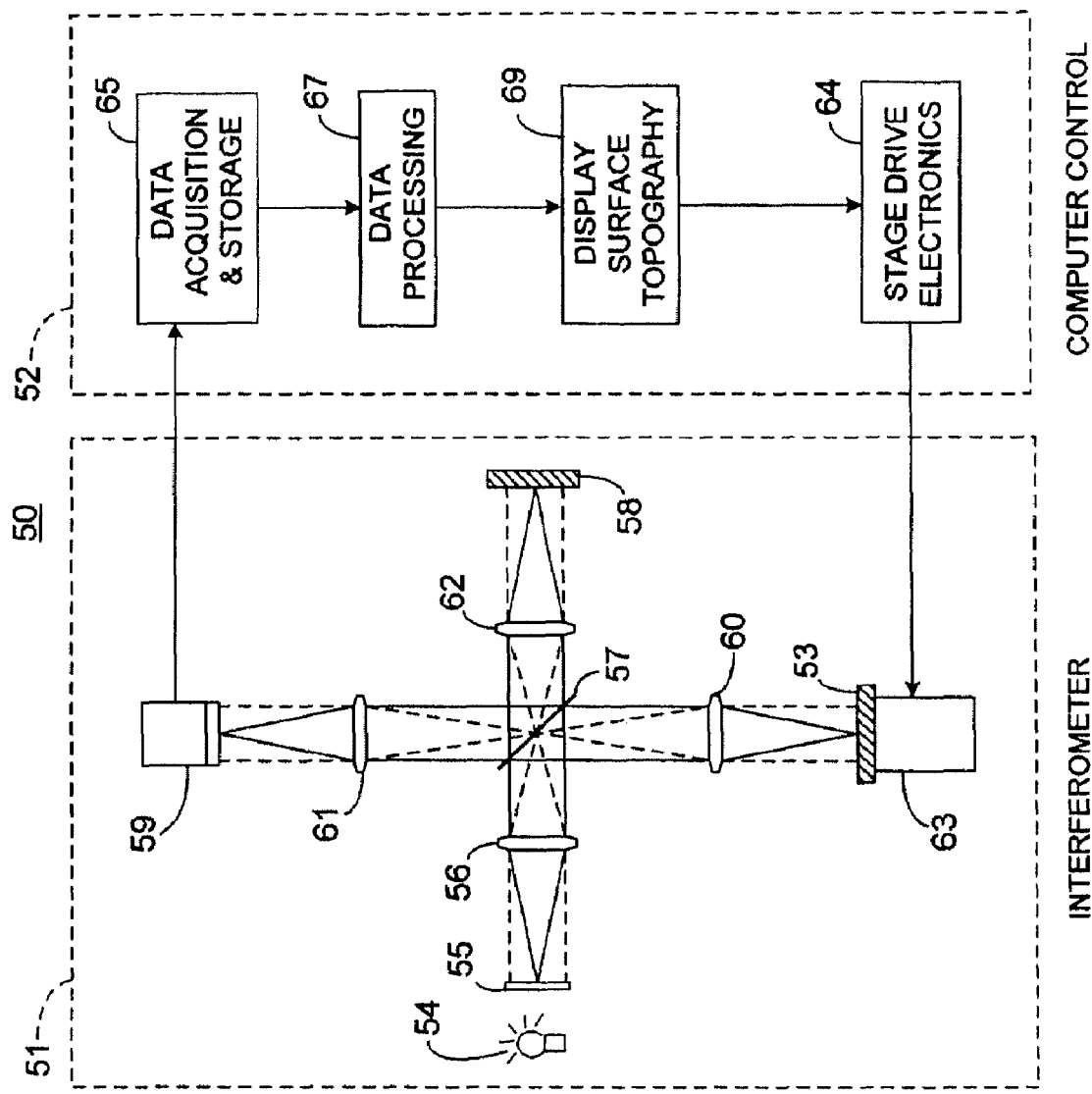
FIG. 9 is an exemplary interferometry system for obtaining interference signals.

Referring to FIG. 9, an exemplary measurement system 50 for obtaining interference signals includes an interferometer 51 and automated computer control system 52. The measurement system 50 is operable to determine one or more spatial properties of a measurement object 53. In some embodiments, the one or more spatial properties relate to a topography and/or a location of the object 53 with respect to another object, e.g., a portion of system 50. In some embodiments, the other object is a reference portion of a photolithography system. In any event, system 50 is operable to determine one or more spatial properties of objects including one or more at least partially covering layers, e.g., a substrate contacted with a layer of photoresist or solder.

A source 54, which may be a spectrally-broadband source, such as a white-light lamp, or include a plurality of different wavelengths, e.g., resulting from a plurality of light emitting diodes, illuminates a diffusing screen 55. As an alternative or in combination with a broadband source, the source 54 can include a narrow band or quasi-monochromatic source, typically having a high numerical aperture. A low coherence interference signal can be obtained using a monochromatic source in combination with a high numerical aperture, e.g., the coherence length may be on the order of a few microns or less.

Lens 56 transmits a collimated beam to a beam-splitting element 57 that transmits a first portion of the beam to a lens 62 and reference object 58. In some embodiments, reference object 58 is optically flat and includes only a single reflecting surface. For example, reference object 58 can be a reference mirror. In some embodiments, reference object 58 exhibits a three-dimensional surface topography and/or includes more than one spaced-apart layer that reflects light. In the following discussion, it is assumed without limitation that reference object 58 is a reference mirror including a single reflective surface.

Beam-splitting element 57 directs a second portion of the beam to a lens 60, which focuses the beam onto measurement object 53. Beam-splitting element 57 combines light reflected from reference mirror 58 and from measurement object 53. The combined light is directed to a lens 61, which focuses the combined light to a detector 59. Light reflected from measurement object 53 and from mirror 58 interfere at detector 59, which produces detector signals indicative of the resultant beam intensity.

Detector 59 typically includes a plurality of detector elements, e.g., pixels, arranged in at least one and more generally two dimensions. In the following discussion, it is assumed without limitation that detector 59 includes a two-dimensional array of detector elements, such as a CCD includes a plurality of pixels. In the embodiment shown, lens 60 and lens 61 focus light reflected from measurement object 53 onto detector 59 so that each detector element of detector 59 corresponds to a respective point, e.g., a small region or location of measurement object 53. Additionally, lens 62 cooperates with lens 61 to image the reference object 58 onto detector 59. Thus, an interference pattern can be observed at detector 59, even for extended (i.e. spatially incoherent) illumination.

As discussed above, measurement object 53 can include more than one reflective surface such as a substrate including one or more at least partially optically transmissive layers. A first reflective surface is defined by the interface between the outermost optically transmissive layer and the surrounding atmosphere (or vacuum). Additional reflective surfaces are defined by each interface between layers or between layers and the substrate. In such embodiments, the light reflected from the measurement object 53 can include a contribution, e.g., a separate beam, reflected from each reflective surface or interface. Because each reflective surface or interface is generally spaced apart along the axis of beam propagation, each separate beam generates a different interference pattern when combined with light reflected from the measurement object 53. The interference pattern observed by detector 59 includes the sum of the interference patterns generated by each separate beam reflected from the measurement object.

System 50 is typically configured to create an optical path length difference (OPD) between light directed to and reflected from reference object 58 and light directed to and reflected from measurement object 53. In some embodiments, measurement object 53 can be displaced or actuated by an electromechanical transducer 63, such as a piezoelectric transducer (PZT), and associated drive electronics 64 controlled by computer 52 so as to effect precise scans along a direction that varies the OPD of the interferometer 51. In some embodiments, system 50 is configured to modify the OPD by moving reference object 58. In some embodiments, system 50 is configured to modify the OPD by an amount at least as great as height variations in a topography of the object. In some embodiments, the optical path length is varied by a distance at least as great as a coherence length of the interferometer, e.g., on the order of a few microns.

System 50 can acquire a plurality of detector signals as the OPD is modified, such by scanning a position of measurement object 53. The detector signals thus acquired can be stored in digital format as an array of interference signals, one interference signal acquired from each pixel of detector 59, each interference signal representing the variation in intensity as a function of OPD for a different location of the measurement object 53. For example, if the detector 59 includes a 128×128 array of pixels and if 64 images are stored during a scan, then there will be approximately 16,000 interference signals each 64 data points in length. In embodiments using a broadband source 54, the interference signals may be referred to as scanning white light interferometry (SWLI) interference signals, more generally as low coherence length scanning interference signals.

After the data has been acquired, the computer 52 can process 67 the interference signal in accordance with, e.g., methods 100 and 110, and output data indicative of a surface topography of the measurement object Various aspects of methods 100,110 and data processing 67 are discussed next.

Preparing an Interferometry Template

Figure 8:
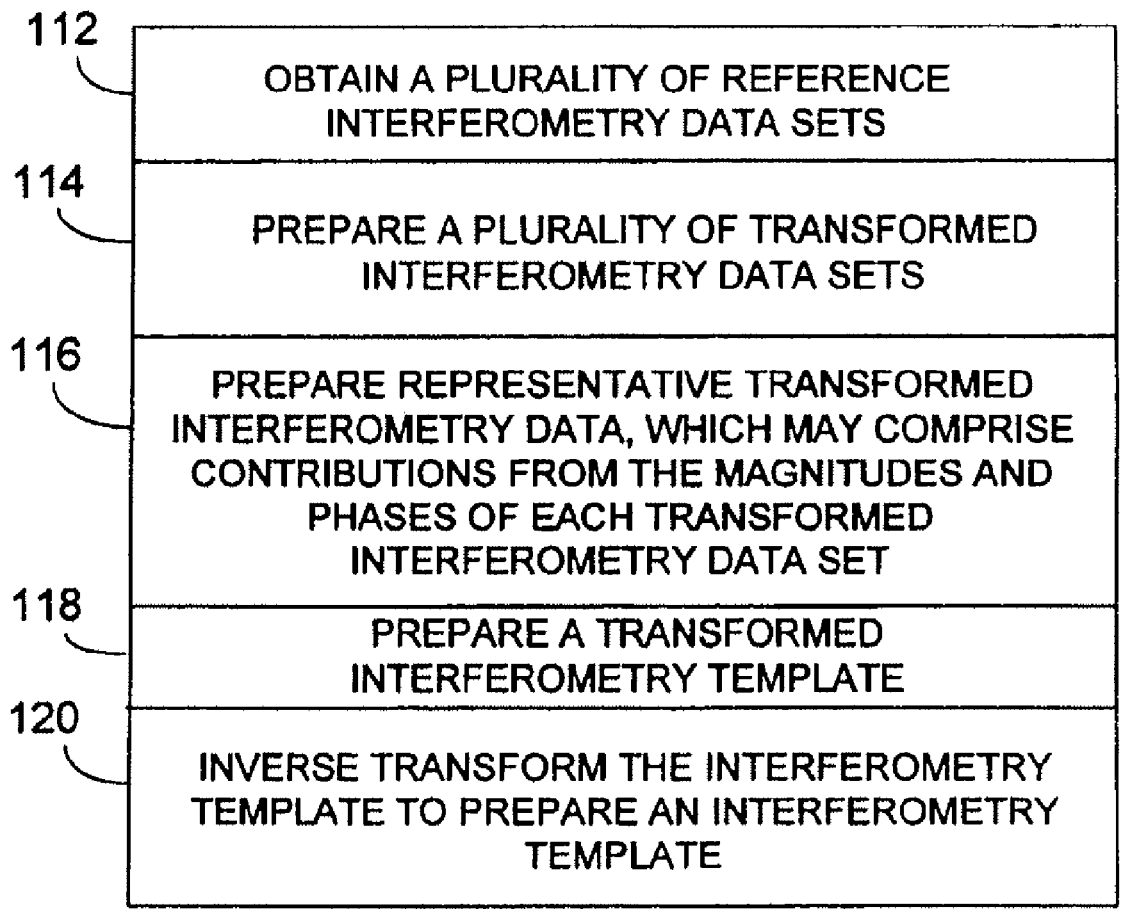
FIG. 8 is a flowchart illustrating a method for preparing a template.

Referring to FIG. 8, a method 110 for obtaining a template includes obtaining 112 a plurality of typically low coherence reference interference signals, e.g., by imaging a plurality of different points of an object. The reference interference signals can be generated theoretically, determined from reference interference signals obtained using a reference object in place of the measurement object, determined from measurement interference signals obtained using the measurement object itself, or by a combination of such techniques. In any event, the plurality of reference interference signals can be transformed 114 to a transformed dimension to prepare a plurality of transformed interference signals, e.g., by Fourier transformation. In step 116, one or more representative transformed interference signals including contributions from more than one of the transformed interferometry sets are prepared. In step 118, a transformed template is prepared. The transformed template can limit or exclude contributions from the topography and position of the object while retaining contributions from the interferometer. The transformed template can include contributions derived from a plurality of the reference interference signals. In some embodiments, the transformed template interferometry data is derived from an average of the transformed interference signals. In step 120, the transformed template is inverse transformed 120 to prepare a template, which can be asymmetrical.

Method 110 for obtaining a template is described without limitation in the context of preparing a template from reference interference signals obtained 112 from a reference object in place of the measurement object. Method 110, however, may include preparing the template from measurement interference signals acquired from a measurement object itself. The reference object typically includes a single reflective surface, e.g., the object can be free of a transparent coating or film. In some embodiments, the reference object produces SWLI interference signals having weak non-linearities, e.g., a silicon carbide flat. The reference object may have a three-dimensional topography so that the reference object height $h_{sys}$ varies at different object points. The object is imaged using an interferometry system with a two-dimensional detector having a plurality of pixels x, e.g., detector 59 of system 50, so that light detected from different object points is detected by different detector pixels. Intensity values are obtained at different scan positions ζ, each position corresponding to a different OPD to obtain a plurality of interference signals, typically one for each detector pixel. The discussion begins with an exemplary description of SWLI data obtained using such a configuration. It should be understood however, that the discussion is applicable to any low coherence interference signals whether obtained by, e.g., scanning to vary the optical pathlength between measurement and reference light or by spatially detecting measurement and reference light over a plurality of optical path length differences. The variation in OPD is generally sufficient to modulate the amplitude of the observed fringes.

Low coherence interference signals can, in some cases, be described via a pure sinusoidal carrier modulated by an envelope. The modulated sinusoidal carrier description can apply in cases including e.g. a symmetric source spectrum, non-dispersive optics and a solid surface object. In general, however, these conditions are not met for real interferometry systems. Accordingly, the following discussion is generalized to include an additional, nonlinear OPD-dependent phase term that absorbs the deviations from a pure sinusoidal carrier. Of course, method 110 can be implemented in terms of other descriptions of low coherence interference signals, e.g., the aforementioned sinusoidal carrier model.

A low coherence interference signal, e.g., a reference interference signal $I_{sys}(\zeta,x)$, detected by a single detector pixel x, varies as a function of scan position $\zeta$, according to:

$$I_{sys}(\zeta,x) = DC_{sys}(x) + \ldots AC_{sys}(x) m_{sys}[\zeta - h_{sys}(x)] \cos\{-[\zeta - h_{sys}(x)]K_0 + \phi_{sys}[\zeta - h_{sys}(x)]\}$$

where $DC_{sys}$ is a constant background, $AC_{sys}$ is the amplitude of an interference signal oscillating at a nominal angular frequency $K_0$ and modulated by an envelope $m_{sys}$ and phase $\phi_{sys}$, and $h_{sys}(x)$ is the height of the object point imaged at pixel x. The signal envelope $m_{sys}$ is related to properties of the light source, the range of wavelengths detected by the detector, and the numerical aperture of the optical system. As discussed above, both the envelope $m_{sys}$ and the phase $\phi_{sys}$ generally vary slowly with scan position. Interference patterns obtained from object locations having different relative positions, e.g., heights, tend to have similarly shaped envelope functions and frequency contents but are shifted along the scan position axis by an amount related to the surface height. The following discussion illustrates the determination of a template, which includes limited or no contributions from the object spatial properties but retains instrumental contributions.

In some embodiments, determining the template includes transforming 114 the reference interference signals to a different dimension, e.g., by the Fourier transformation of each reference interference signal to obtain a respective transformed interference signal $q_{sys}(K,x)$, where K is the unit of the transformed dimension, e.g., wavenumbers, inverse scan position, or data acquisition frequency.

Fourier transformation of an interference signal can be performed according to:

$$q_{sys}(K, x) = FT\{I_{sys}(\zeta, x)\} \quad (1)$$

where $$FT\{I(\zeta)\} = \frac{1}{N} \int_{-\infty}^{\infty} I(\hat{\zeta}) \exp(iK\hat{\zeta}) d\hat{\zeta} \quad (2)$$

and where the normalization integral is $$N = \int_{-\infty}^{\infty} d\hat{\zeta}. \quad (3)$$

Here, the "^" is used to indicate that $\hat{\zeta}$ is a free variable of integration in Eqs.(2) and (3). Upon Fourier transformation of the reference interference signals and application of the Fourier shift theorem, the transformed interference signal for each pixel x can be expressed as:

$$q_{sys}(K,x) = \delta(K)DC_{sys}(x) + \tfrac{1}{2}AC_{sys}(x)[G^*_{sys}(-K-K_0,x) + G_{sys}(K-K_0,x)] \quad (4)$$

where $$G_{sys}(K,x) = \exp[iKh_{sys}(x)]FT\{m_{sys}(\zeta)\exp[i\phi_{sys}(\zeta)]\} \quad (5)$$

and $$G^*_{sys}(-K,x) = \exp[iKh_{sys}(x)]FT\{m_{sys}(\zeta)\exp[-i\phi_{sys}(\zeta)]\}. \quad (6)$$

The K<0 frequency components of the transformed interference signals are the complex conjugates of the positive-frequency components of the spectrum, with K inverted.

The transformed interference signals may be subjected to a windowing function to select a frequency-domain region of interest (ROI), e.g., a window defined as $K_{min}$ to $K_{max}$. The window may be selected to be dominated by or include only non-DC positive-frequency spectral components of $G_{sys}(K-K_0)$ with meaningful intensity or amplitude with respect to noise in the ROI. The windowing function may be an apodizing function.

Preparing 118 representative transformed interferometry data can include combining a plurality of the transformed interference signals such as by averaging with or without weighting, e.g., noise based weighting. In some embodiments, preparing 118 includes preparing a first transformed interference signal that includes contributions from the magnitudes of the transformed interference signals and a second transformed interference signal that includes contributions from the phases of the transformed interference signals. For example, first transformed interference signal including a combination of the magnitudes of the transformed interference signals, e.g., the field average of the magnitudes, can be determined as:

$$\overline{P_{sys}}(K - K_0) = \frac{\int P_{sys}(K - K_0, x) dx}{\int dx} \quad (7)$$

where $$P_{sys}(K - K_0, x) = AC_{sys}(x)|2G_{sys}(K - K_0, x)| \quad (8)$$

and a combination of the phases of the transformed interference signals, e.g., the field average of the phases, can be determined as:

$$\overline{\phi'_{sys}}(K - K_0) = \frac{\int \phi''_{sys}(K - K_0, x) dx}{\int dx} \quad (9)$$

where the measured phase as a function of angular frequency is $$\phi_{sys}'''(K-K_0,x) = \text{connect}_K[\phi_{sys}''''(K-K_0,x)] \quad (10)$$

for $$\phi_{sys}''''(K-K_0,x) = \arg[G_{sys}(K-K_0,x)]. \quad (11)$$

The three primes for the phase data $\phi_{sys}'''$ in the frequency domain indicate that there are multiple $2\pi$ uncertainties in the phase information: (1) from angular frequency to angular frequency K, (2) from pixel to pixel, and (3) overall with respect to an absolute reference. The connect$_K$ function in Eq.(10) removes one of these primes by connecting across angular frequencies for each pixel. Examples of functions for removing such $2\pi$ uncertainties are discussed in U.S. application Ser. No. 10/053,106, filed Nov. 2, 2001, titled Height scanning interferometry method and apparatus including phase gap analysis and Ghiglia et al., Two Dimensional Phase Unwrapping: Theory, Algorithms, and Software, John Wiley & Sons, Inc., New York, 1998, which references are incorporated herein by reference. The field averaging in Eq.(9) removes another prime, leaving only the single prime that indicates that the overall offset value for the phase is unknown.

A transformed template $\overline{\tilde{q}_{sys}}$ can be prepared 118 as:

$$\overline{\tilde{q}_{sys}}(K) = \overline{P_{sys}}(K-K_0)\exp\{\mathrm{nonlin}_K[\overline{\phi'_{sys}}(K-K_0)]\} \tag{12}$$

where the function nonlin$_K$ returns that portion of the argument that is nonlinear with respect to angular frequency K, thereby removing the linear change of phase with angular frequency K. The linear change of phase with angular frequency is related to the object topography related shift of the interference pattern along the scan position axis. Removing the linear change of frequency can retain certain instrument related contributions to the interference patterns. Thus, the template relates to a response of the instrument to an object. It should be noted that the linear change of phase can be removed prior to combining interference signals.

The tilde "~" in Eq.(12) indicates that the transformed template $\overline{\tilde{q}_{sys}}$ contains only the positive nonzero frequencies. As an alternative to including only nonzero frequencies, the transformed template can include other frequencies as well.

The transformed template $\overline{\tilde{q}_{sys}}$ can be inverse transformed to prepare a template in the scan domain:

$$\overline{\tilde{I}_{sys}}(\zeta) = \overline{m_{sys}}(\zeta)\exp[-iK_0\zeta + i\phi_{sys}(\zeta)] \tag{13}$$

according to an inverse Fourier transform:

$$\overline{\tilde{I}_{sys}}(\zeta) = FT^{-1}\{\overline{\tilde{q}_{sys}}(K)\} \tag{14}$$

$$FT^{-1}\{q(K)\} = \int_{-\infty}^{\infty} q(K)\exp(-iK\zeta)dK \tag{15}$$

where, for convenience, the averaged scaling factor $\overline{AC_{sys}}$ is assigned a value of 1.

The real part of the function $\overline{\tilde{I}_{sys}}$ has a readily separable envelope and phase at each scan position. The envelope is $$m_{sys}(\zeta) = |\overline{\tilde{I}_{sys}}(\zeta)| \tag{16}$$

while the phase is $$\phi_{sys}{}''(\zeta) = \mathrm{connect}_\zeta[\overline{\phi_{sys}{}'''}(\zeta)] \tag{17}$$

for $$\overline{\phi_{sys}{}'''}(\zeta) = \arg[\overline{\tilde{I}_{sys}}(\zeta)]. \tag{18}$$

The template may have the same units as an interference signal, e.g., detector intensity v. scan position. The transformed template may have the same units as transformed interference signals, e.g., intensity or amplitude v. inverse scan position. The template may be generally representative of the response of the interferometer to an object, e.g., a point of an object interface. For example, as discussed above, determining the template can include reducing or removing contributions related to, e.g., object-location and surface height $h_{sys}$, while retaining instrument related contributions, e.g., contributions related to the shape of the envelope and phase. Contributions from the amplitude of the oscillating and constant background signals $AC_{sys}$, $DC_{sys}$ may also be reduced or removed. Either template $\overline{\tilde{q}_{sys}}$ or $\overline{\tilde{I}_{sys}}$ can be used to determine a spatial property of a measurement object whether or not the template was acquired from a reference object or in another fashion, e.g., from the measurement object itself.

In some embodiments, a portion of the template can be selected for use in determining the spatial property. For example, a windowed portion $\tilde{I}_{pat}$ of the template can be selected using a window function:

$$\tilde{I}_{pat}(\zeta) = w(\zeta)\overline{\tilde{I}_{sys}}(\zeta) \tag{19}$$

The template window is given by:

$$w(\zeta) = \begin{cases} 1 & \text{for } \zeta_{start} \leq \zeta \leq \zeta_{stop} \\ 0 & \text{otherwise} \end{cases} \tag{20}$$

An exemplary window is centered about a zero scan position $\zeta = 0$ in which case an appropriate window may be:

$$\zeta_{start} = -\frac{\Delta\zeta}{2} \tag{21}$$

$$\zeta_{stop} = +\frac{\Delta\zeta}{2}$$

where the window width $\Delta\zeta$ may be determined arbitrarily. Alternatively, the end-points of the window function can be defined with respect to relative to a peak amplitude of the envelope, e.g., the window may have a width extending to scan positions corresponding to 10% of the peak amplitude.

In some embodiments, the windowed template is not centered about zero scan position. In some embodiments, the windowed template is asymmetrical with respect to the interferometry data, e.g., the windowed template may extend to a scan position corresponding to a 10% amplitude at one side of the template while not extending to a scan position corresponding the same relative amplitude on the other side of the template. For example, $\zeta_{start}$ can be selected to correspond with the scan position of the peak of the envelope $m_{sys}$ and only template data corresponding to scan positions on one side of the peak retained. Such a truncated template can be used to determine a region or interest or spatial property of a surface or interface in the presence of more than one closely spaced layers, e.g., a substrate having a thin film.

Determining a Region of Interest or Spatial Property Based on a Template

Determining a region of interest or a spatial property of a measurement object can include comparing an interference signal and a template, e.g., by locating a portion of a measurement interference signal that corresponds to, e.g., has shape features similar to, a template. The comparison can be expressed as a merit function determined from cross-correlation between the interference signal and the template. Two methods for comparing an interference signal and a template are discussed next.

A First Method of Determining a Spatial Property Based on a Template

The following discussion illustrates use of a template $\tilde{I}_{pat}$ to determine a region of interest or spatial property of a measurement object. A plurality of measurement interference signals $\tilde{I}_{ex}$ are acquired from the measurement object. Each interference signal describes the detector intensity v. scan position signal for a pixel x as:

$$I_{ex}(\zeta,x) = DC_{ex}(x) + \ldots AC_{ex}(x)m_{ex}[\zeta-h_{ex}(x)]\cos\{-[\zeta-h_{ex}(x)]K_0 + \phi_{ex}[\zeta-h_{ex}(x)]\}\quad(22)$$

The Fourier transform of each interference signal $\tilde{I}_{ex}$ can be obtained as:

$$q_{ex}(K,x) = FT\{I_{ex}(\zeta,x)\}\quad(23)$$

$$q_{ex}(K,x) = \delta(K)DC_{ex}(x) + \tfrac{1}{2}AC_{ex}(x)[G^*_{ex}(-K-K_0,x) + G_{ex}(K-K_0,x)]\quad(24)$$

where $$G_{ex}(K) = FT\{m_{ex}(\zeta)\exp[i\phi_{ex}(\zeta)]\}\exp[iKh_{ex}(x)].\quad(25)$$

A partial spectrum can be obtained from the positive-frequency portion of each Fourier transformed measurement interference signal:

$$\tilde{q}_{ex}(K) = AC_{ex}(x)G_{ex}(K-K_0,x).\quad(26)$$

Each partial spectrum can be inverse transformed as:

$$\tilde{I}_{ex}(\zeta) = FT^{-1}\{\tilde{q}_{ex}(K)\}\quad(27)$$

$$\tilde{I}_{ex}(\zeta,x) = AC_{ex}(x)m_{ex}[\zeta-h_{ex}(x)]\exp\{-[\zeta-h_{ex}(x)]K_0+\phi_{ex}[\zeta-h_{ex}(x)]\}\quad(28)$$

The real part of each inverse transformed partial spectrum $\tilde{I}_{ex}$ for a pixel x corresponds to the interference signal $I_{ex}$ for the same pixel. Additionally, the phase and envelope of the spectra $\tilde{I}_{ex}$ are readily separable by simple operations, e.g. the product of the signal strength $AC_{ex}(x)$ and the envelope $m_{ex}$ can be determined from the magnitude of the complex function $\tilde{I}_{ex}$ as:

$$AC_{ex}(x)m_{ex}[\zeta-h_{ex}(x)] = |\tilde{I}_{ex}(\zeta,x)|.\quad(29)$$

At least a portion of the envelope $m_{pat}$ of the template interferometry data typically has shape features similar to the envelope $m_{ex}$ describing the decay of each spectrum $\tilde{I}_{ex}$. Differences between the envelopes are typically related to the linear offset $h_{ex}$ of the object location imaged at each pixel x and the scaling factor $AC_{ex}(x)$. Additionally, differences between the experimental and interference pattern template phase offsets $\phi_{ex}$, $\phi_{pat}$ are also related to the height $h_{ex}$ of the object location imaged at each pixel x. Typically, the differences in the phase offsets are linearly proportional to the height $h_{ex}$. Accordingly, differences between the envelopes $m_{ex}$, $m_{pat}$ and/or differences between the phase offsets $\phi_{ex}$, $\phi_{pat}$ can be used to determine a spatial property of a measurement object. The method may include identifying a scan position $\zeta_{best}$ for which the shapes of the envelopes $m_{ex}$, $m_{pat}$ and $\phi_{ex}$, $\phi_{pat}$ are best matched. The results of the comparison can be described by a merit function. In some embodiments, the merit function is determined by cross-correlating the interference signal and the template. The cross correlation can be a complex correlation or a partially-complex correlation.

In some embodiments, identifying $\zeta_{best}$ is identified using a merit function $\Pi$ derived from the correlation of the template with the interference signal within a subset of the interferometry data as defined by the window w:

$$\Pi(\zeta,x) = \frac{|\tilde{I}(\zeta,x)|^2}{\langle m_{pat}^2\rangle\langle|\tilde{I}_{ex}(\zeta,x)|^2\rangle}\quad(30)$$

where $$\tilde{I}(\zeta,x) = \frac{1}{N}\int_{-\infty}^{\infty}\tilde{I}^*_{pat}(\hat{\zeta})\tilde{I}_{ex}(\zeta+\hat{\zeta},x)d\hat{\zeta}.\quad(31)$$

is the complex correlation function and $$\langle m_{pat}^2\rangle = \frac{1}{N}\int_{-\infty}^{\infty}|\tilde{I}_{pat}(\hat{\zeta})|^2 d\hat{\zeta}\quad(32)$$

$$\langle|\tilde{I}_{ex}(\zeta,x)|^2\rangle = \frac{1}{N}\int_{-\infty}^{\infty}|\tilde{I}_{ex}(\zeta+\hat{\zeta},x)|^2 w(\hat{\zeta})d\hat{\zeta}\quad(33)$$

are normalizations that make the merit function of independent of signal-strength. The normalization can be dependent on a shape of the interference signal, e.g., upon the moving average of the square magnitude of the complex interference signal within the window w. Eq.(30) is the square of the "Pearson's r" familiar from statistics and can also be derived by a least-squares analysis. Use of the complex conjugate $\tilde{I}^*_{pat}$ of the template cancels the synchronous linear phase term $K_0\zeta$ and maximizes $\Pi$ for the case of a match of $\phi_{ex}$, $\phi_{pat}$. The absolute value | | of the correlation removes any residual complex phase.

To prevent $\Pi(\zeta)$ from generating false high values or encountering a singularity at low signal levels, a minimum value MinDenom can be added to the denominator as:

$$\langle\tilde{I}_{ex}(\zeta)|^2\rangle \leftarrow \langle|\tilde{I}_{ex}(\zeta)|^2\rangle + \text{MinDenom}\cdot\max(|\tilde{I}_{ex}|^2)\quad(34)$$

where the max( ) function returns the maximum value of the signal strength $|\tilde{I}_{ex}|$ over the full scan length $\zeta$, and MinDenom is the minimum relative signal strength that is considered to provide relevant information. For example, MinDenom can be set to 5% of the maximum signal or other value depending upon the level of noise. The correlation may also be performed by weighting the data to give relative noisy data less influence in determining the result of the correlation.

The correlation integral $\tilde{I}$ can be performed in the frequency domain using the correlation theorem:

$$\tilde{I}(\zeta) = FT^{-1}\{\tilde{q}^*_{pat}(K)\tilde{q}_{ex}(K)\}\quad(35)$$

where $$FT\{\tilde{I}^*_{pat}(\zeta,x)\} = \tilde{q}^*_{pat}(-K,x)\quad(36)$$

and $$\tilde{q}_{pat}(K,x) = FT\{\tilde{I}_{pat}(\zeta,x)\}.\quad(37)$$

The merit function $\Pi$ yields the best match position $\zeta_{best}$. Typically, the best match position is a peak of the merit function and the relative amplitude of the peak is a measure of the quality of the match, ranging from zero to one, with one corresponding to a perfect match. The search for the best match position can include additional conditions and constraints to increase robustness. A valid best match position $\zeta_{best}$ can be selected to have a signal strength:

$$|\tilde{I}_{ex}(\zeta_{best})| > \text{GreyLevels}\cdot\text{MinMod}\quad(38)$$

where MinMod is a 0-100% value. A typical MinMod is 10% for a smooth surface and usually lower for a rough surface. The value of the merit function at the best match position can also be required to exceed a selected minimum MinMerit to reduce spurious results:

$$\Pi(\zeta_{best}) > \text{MinMerit} \quad (39)$$

where MinMerit ranges from 0 to 1, with an exemplary value being about 0.3.

For measurement objects lacking closely spaced interfaces or surfaces, the merit function can be searched for the scan position $\zeta$ at which $\Pi$ is maximized. For measurement objects having closely spaced interfaces or surfaces, multiple scan positions may satisfy both the MinMod and MinMerit conditions. The scan positions can be identified by, for example, using a search algorithm that finds the first peak that satisfies the MinMerit condition starting at the one end, e.g., the high end of the $\zeta$-coordinate scan. The algorithm further establishes MinRelMod and MinRelMerit conditions, which require that smaller peaks have signals relatively comparable to the highest peaks according to some percentage value.

An alternative or complementary search routine includes searching the merit function for the first scan position for which $\Pi$ exceeds a certain threshold value, even if it is not a peak. This approach may be used for analysis of data resulting from measurement objects with closely spaced surfaces or interfaces where, e.g., the presence of an underlying substrate obscures a peak resulting from a film-air interface.

A method for searching $\Pi$ can include determining a derivative of the merit function, e.g., to locate surface heights.

The best-match position $\zeta_{best}$ typically relates to a scan position at which the envelopes $m_{ex}$, $m_{pat}$ are aligned. Accordingly, the best match position from cross-correlation can provide a normal resolution or CT-Norm height measurement:

$$h_\Theta(x) = \zeta_{best}(x) \quad (40)$$

where the subscript $\Theta$ indicates that the height measurement $h_\Theta$ (as opposed to the true height h) is based on a coherence approach or fringe-contrast analysis.

As in frequency domain analysis, the normal resolution height profile $h_\Theta$ may be free of fringe-order uncertainty but have a certain noise level. Frequency domain analysis is described in U.S. Pat. No. 5,398,113, which is incorporated herein by reference. The noise level may be reduced by using the underlying carrier fringes in the interference pattern.

In correlation template analysis, the argument of the correlation function $$\phi''(\zeta) = \text{connect}_\zeta \{arg[\tilde{I}(\zeta)]\} \quad (41)$$

has a relative phase value equal to the difference $\phi_{ex} - \phi_{pat}$. The relative phase $\phi''$ provides additional, fine-scale information regarding the template matching. The double prime in Eq. (41) indicates that there remains a two-fold uncertainty in the fringe order for $\phi''$, both from pixel to pixel within the image and overall with respect to the datum, after connecting across scan positions $\zeta$. The relative phase $\phi''$ evolves approximately at a linear rate $K_0$ with scan position $\zeta$. The relative phase $\phi''$ at the peak correlation position $\zeta_{best}$ is the phase gap with respect to the envelope portion of the interference pattern template:

$$A''(x) = \phi''[\zeta_{best}(x)]. \quad (42)$$

This leads to a higher-resolution phase profile:

$$\theta''(x) = A''(x) + \Theta(x) \quad (43)$$

where $\Theta$ is the coherence profile in units of phase at the nominal angular frequency $K_0$:

$$\Theta(x) = K_0 h_\Theta(x). \quad (44)$$

The coherence profile $\Theta(x)$ in Eq.(44) can be determined using nominal angular frequency $K_0$ consistent with the mathematical analysis. An incorrect $K_0$ typically creates interpolation errors. In some embodiments, the template is autocorrelated with itself:

$$\tilde{I}_{auto}(\zeta) = \frac{1}{N} \int_{-\infty}^{\infty} \tilde{I}^*_{pat}(\hat{\zeta}) \tilde{I}_{pat}(\zeta + \hat{\zeta}) d\hat{\zeta}. \quad (45)$$

so that the auto-correlation phase can be searched as a function of scan position $\zeta$:

$$\phi_{auto}''(\zeta) = \text{connect}_\zeta\{arg[\tilde{I}_{auto}(\zeta)]\}. \quad (46)$$

Knowing the increments between scan positions $\zeta_{step}$, the nominal frequency $K_0$ is given by:

$$K_0 = \frac{\phi_{auto}''\left(\zeta_{best} + \frac{1}{2}\zeta_{step}\right) - \phi_{auto}''\left(\zeta_{best} - \frac{1}{2}\zeta_{step}\right)}{\zeta_{step}}. \quad (47)$$

The nominal frequency $K_0$ can be used to remove the fringe order uncertainty using a field-connected, approximate phase gap $\alpha'$ according to:

$$\theta'(x) = \theta''(x) - 2\pi \text{Round}\left[\frac{A''(x) - \alpha'}{2\pi}\right] \quad (48)$$

where Round function returns the nearest integer to its argument. A phase gap $\alpha'$ can be determined using, e.g., a sin-cosine averaging technique. Exemplary techniques for determining a phase gap are described in U.S. patent application Ser. No. 10/053,106, entitled "HEIGHT SCANNING INTERFEROMETRY METHOD AND APPARATUS INCLUDING PHASE GAP ANALYSIS" and filed Nov. 2, 2001, U.S. patent application Ser. No. 10/429,175, entitled "PHASE GAP ANALYSIS FOR SCANNING INTERFEROMETRY" and filed May 2, 2003, and "Determination of fringe order in white-light interference microscopy," Appl. Opt. 41(22) 4571 (2002), which documents are incorporated herein by reference. Upon determining the phase gap, the measurement object height can be determined using the coherence profile and nominal frequency $K_0$ as:

$$h_\Theta(x) = \theta'(x)/K_0. \quad (49)$$

A Second Method of Determining a Spatial Property Based on a Template

The above method for determining a spatial property included transformation of the interference signals from the optical path length difference dimension to an inverse dimension, e.g., inverse scan dimension. In some embodiments, interference signals are processed in the scan dimension, e.g., without transformation to an inverse dimension. The processing can include cross-correlating the interference signal and a template in the scan dimension. For example, the processing can include subjecting each interference signal and a template to a partially complex correlation as follows:

$$I(\zeta, x) = \frac{2}{N} \int_{-\infty}^{\infty} \tilde{I}^*_{pat}(\hat{\zeta}) I_{ex}(\zeta + \hat{\zeta}, x) d\hat{\zeta}. \quad (50)$$

The properties of the template can be selected to enhance the sensitivity of the partially complex correlation to best match positions between the interference signal and template. Writing the interference signal as:

$$I_{ex}(\zeta, x) = DC_{ex}(x) + \frac{1}{2}[\tilde{I}_{ex}(\zeta, x) + \tilde{I}^*_{ex}(\zeta, x)], \quad (51)$$

the partially complex correlation can be expressed as a sum of two parts:

$$I(\zeta,x) = \tilde{I}(\zeta,x) + err(\zeta,x) \quad (52)$$

where the undesired err term is given by:

$$err(\zeta, x) = \frac{2DC_{ex}(x)}{N} \int_{-\infty}^{\infty} \tilde{I}^*_{pat}(\hat{\zeta}) d\hat{\zeta} + \frac{1}{N} \int_{-\infty}^{\infty} \tilde{I}^*_{pat}(\hat{\zeta}) \tilde{I}^*_{ex}(\zeta + \hat{\zeta}, x) d\hat{\zeta}. \quad (53)$$

Properties of the template $\tilde{I}_{pat}$ can be selected to make the err small, e.g., drive the term toward zero so that the result of the correlation is determined by the first term on the left of Eq. 53. For example, the Fourier transform $\tilde{q}_{pat}$ of such a template $\tilde{I}_{pat}$ may have low or negligible values outside of the positive-frequency neighborhood of the expected frequencies of the interference signal. In some embodiments, the average or DC value of the complex portion of the template $\tilde{I}^*_{pat}$ are zero, and the correlation of $\tilde{I}^*_{pat}$ and (the mathematically hypothetical) $\tilde{I}^*_{ex}$ is also zero. For example, the template $\tilde{I}_{pat}$ can have zero negative frequency components.

A template $\tilde{I}_{pat}$ consisting essentially of strong, non-DC positive-frequency spectral components in the range $K_{min} \ldots K_{max}$ can be prepared by subjecting the transformed template prepared as discussed above to an apodizing window function. In some embodiments, the appodizing windowing function includes a raised cosine or von-Hann window instead of a window with a sharper cut-off in the frequency domain:

$$ROI(K) = 0.5 + 0.5\cos\left[2\pi\left(\frac{K - K0}{\Delta K}\right)\right]. \quad (54)$$

The apodized windowing function reduces ringing when generating $\overline{\tilde{I}_{sys}}$ and makes it easier to contain all of the important information about the interference pattern within a limited scan length. Note that to accommodate the apodization, the total frequency-domain range $\Delta K$ may be larger than a square or rectangular windowing function, e.g., twice as wide in the frequency domain.

A scan domain windowing function w having reduced sharpness as compared to a square or rectangular window can also be used:

$$w(\zeta) = 0.5 + 0.5\cos\left(\frac{2\pi\zeta}{\Delta\zeta}\right) \quad (55)$$

The interference pattern template is given by the product of the template and the scan domain windowing function:

$$\tilde{I}_{pat}(\zeta) = w(\zeta)\overline{\tilde{I}_{sys}}(\zeta) \quad (56)$$

where $\overline{\tilde{I}_{sys}}$ includes contributions from a plurality of interference signals. An asymmetric window can be prepared by shifting w to the right by an amount $\Delta\zeta/4$. Typically, however, the window is set about the $\zeta=0$ position.

A final in-line pattern template $\tilde{I}_{pat.inl}$ can be prepared by retaining only nonzero values and noting the starting offset $\zeta_{offs}$. The function $\tilde{I}_{pat.inl}$ is used as a kernel in a discrete partially-complex correlation:

$$I(\zeta, x) = \frac{2}{N} \int_{-\infty}^{\infty} \tilde{I}^*_{pat.inl}(\hat{\zeta}) I_{ex}(\zeta + \hat{\zeta} + \zeta_{offs}, x) d\hat{\zeta}, \quad (57)$$

where the optional offset $\zeta_{offs}$ preserves the zero position so that it coincides with that of a Fourier transformation implementation.

The number of frames or buckets for the convolution kernel $\tilde{I}_{pat.inl}$ varies depending on the coherence length of the instrument, the scan rate (nm/frame) and the pattern threshold parameter. For example, with the pattern threshold set to 20%, the $\Delta\zeta$ for the window w spans the width of the system characterization signal envelope to the 20% of levels on either side of maximum. For a 100-nm bandwidth, 560-nm center wavelength and an 80-nm/frame scan rate, the kernel $\tilde{I}_{pat.inl}$ spans approximately 23 buckets. Upon increasing the pattern threshold to 40%, $\tilde{I}_{pat.inl}$ decreases to 17 buckets.

A merit function can be determined as follows:

$$\Pi_{inline}(\zeta, x) = \frac{|I(\zeta, x)|^2}{\langle m^2_{pat}\rangle\langle m^2_{ex}\rangle} \quad (58)$$

where $I$ is the in-line, partially complex correlation defined by Eq.(57). The normalization can be determined from a selected, arbitrary single strength, e.g., a signal just under saturation. For example, such a signal may be one-half the number of digital grey levels in the detector:

$$\langle m^2_{ex}\rangle = \frac{1}{N}\left(\frac{greylevels}{2}\right)^2 \int_{-\infty}^{\infty} w(\hat{\zeta}) d\hat{\zeta}. \quad (59)$$

The merit function oscillates with interference signal strength, even if the quality of the pattern match does not change. In some embodiments, determination of the merit function operates similarly to the application of a PSI algorithm (defined by the conjugate kernel $\tilde{I}^*_{pat.inl}$) proceeding step by step through an interference signal $I_{ex}$. This can be illustrated by rewriting the partially complex correlation of Eq.(57) in terms of discrete data:

$$\tilde{I}_\zeta = \sum_{\hat{z}} c_{\hat{z}}(I_{ex})_{\hat{z}} + i\sum_{\hat{z}} s_{\hat{z}}(I_{ex})_{\hat{z}} \quad (60)$$

with algorithm coefficients defined as:

$$s_{\hat{z}} = -Im\{(\tilde{I}_{pat.inl})_{\hat{z}}\} \quad (61)$$

$$c_{\hat{z}} = Re\{(\tilde{I}_{pat.inl})_{\hat{z}}\}. \quad (62)$$

Therefore:

$$|\tilde{I}_\zeta| = \sqrt{\left[\sum_{\hat{z}} s_{\hat{z}}(I_{ex})_{\hat{z}}\right]^2 + \left[\sum_{\hat{z}} c_{\hat{z}}(I_{ex})_{\hat{z}}\right]^2} \quad (63)$$

and $$\arg\{\tilde{I}_\zeta\} = \arctan\left\{\frac{\sum_{\hat{z}} s_{\hat{z}}(I_{ex})_{\hat{z}}}{\sum_{\hat{z}} c_{\hat{z}}(I_{ex})_{\hat{z}}}\right\}. \quad (64)$$

The merit function based on the partially complex correlation can be searched to identify locations that correspond to a region of interest, e.g., to an interface of an object. For example, to determine a scan position corresponding to an outer surface of an object, the merit function can be searched for the first peak from the right (assuming that scan positions to the right correspond to increased distances from the object). To determine a scan position corresponding to an outer surface of a film, the merit function can be searched for the first peak from the right assuming that at least two merit peaks are present. Film thickness can be determined from the scan positions corresponding to the strongest two peaks of the merit function.

In some embodiments, the merit function approximates the square of the normalized signal strength. Accordingly, the square root of the merit function can be searched for peaks:

$$m_{ex}(\zeta, x) \approx \frac{greylevels}{2}\sqrt{\Pi_{inline}(\zeta, x)},$$

The merit function can be reduced, with all values below MinMod² set to zero. The reduced merit function is then searched for peaks. Once a peak is located, more precise information can be obtained by interpolation between neighboring discrete scan positions using the original $\Pi_{inline}$ merit function.

The merit function Π differs from a simple signal strength or envelope calculation in that it evaluates how well the experimental signal matches the interference pattern template $\tilde{I}_{pat}$ within the window w. For this reason, it requires normalization to the signal magnitude.

Processing and Processor Code

Any of the computer analysis methods described above can be implemented in hardware or software, or a combination of both. The methods can be implemented in computer programs using standard programming techniques following the method and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis method can also be implemented as a computer-readable storage medium, configured with a computer program, where the storage medium so configured causes a computer to operate in a specific and predefined manner to perform the functions described herein.

Exemplary Applications

The low coherence interferometry methods and systems described above may used for any of the following surface analysis problems: simple thin films; multilayer thin films; sharp edges and surface features that diffract or otherwise generate complex interference effects; unresolved surface roughness; unresolved surface features, for example, a sub-wavelength width groove on an otherwise smooth surface; dissimilar materials; polarization-dependent properties of the surface; and deflections, vibrations or motions of the surface or deformable surface features that result in incident-angle dependent perturbations of the interference phenomenon. For the case of thin films, the variable parameter of interest may be the film thickness, the refractive index of the film, the refractive index of the substrate, or some combination thereof. Exemplary applications including objects and devices exhibit such features are discussed next.

Photolithography

Figure 10A:
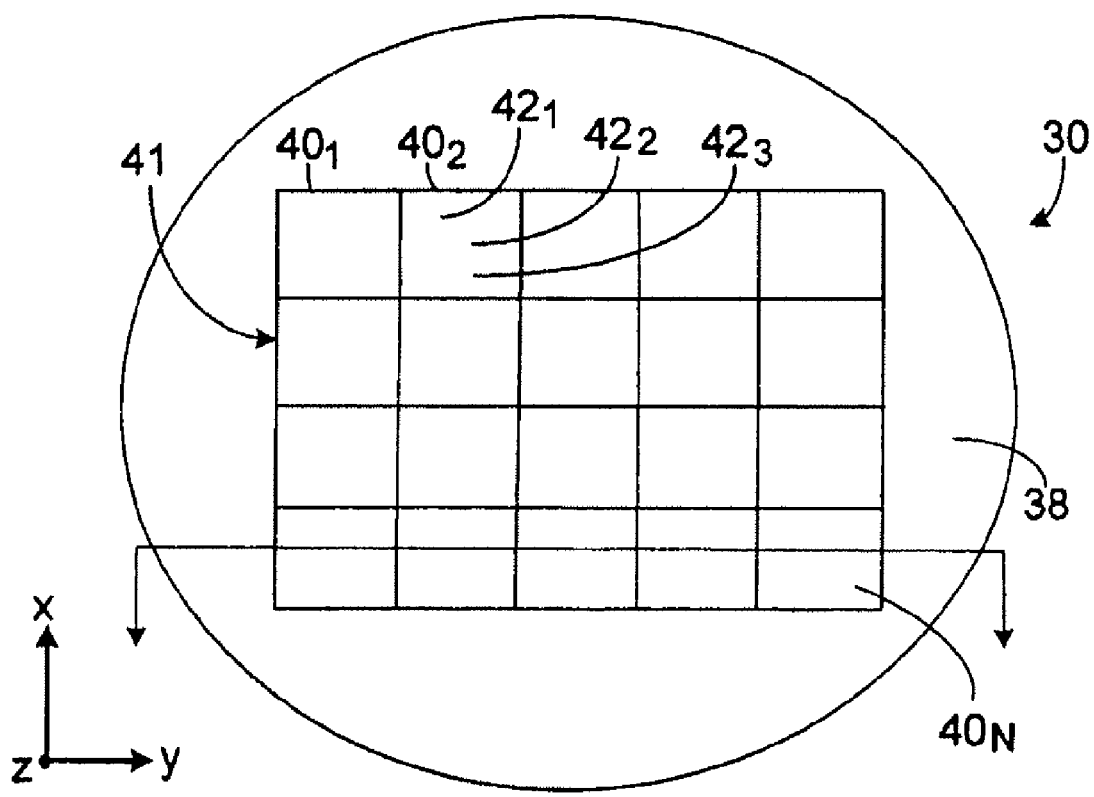
FIG. 10a is a cross-section of a measurement object including a substrate and an overlying layer, e.g., a thin film.
Figure 10B:
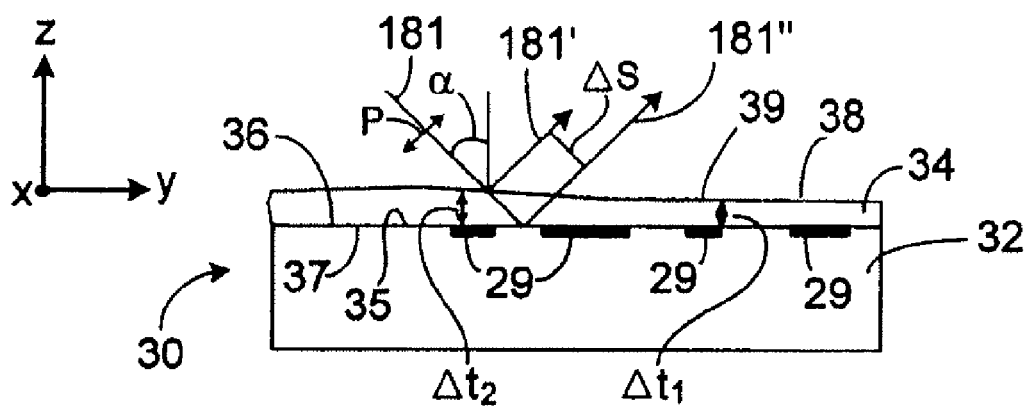

In many microelectronics applications, photolithography is used to pattern a layer of photoresist overlying a substrate, e.g., a silicon wafer. Referring to FIGS. 10a and 10b, an object 30 includes a substrate, e.g., a wafer, 32 and an overlying layer, e.g., photoresist layer 34. Object 30 includes a plurality of interfaces as occur between materials of different refractive index. For example, an object-surroundings interface 38 is defined where an outer surface 39 of photoresist layer 34 contacts the environment surrounding object 30, e.g., liquid, air, other gas, or vacuum. A substrate-layer interface 36 is defined between a surface 35 of wafer 32 and a bottom surface 37 of photoresist layer 34. Surface 35 of the wafer may include a plurality of patterned features 29. Some of these features have the same height as adjacent portions of the substrate but a different refractive index. Other features may extend upward or downward relative to adjacent portions of the substrate. Accordingly, interface 36 may exhibit a complex, varying topography underlying the outer surface of the photoresist.

A photolithography apparatus images a pattern onto the object. For example, the pattern may correspond with elements of an electronic circuit (or the negative of the circuit). After imaging, portions of the photoresist are removed revealing the substrate underlying the removed photoresist. The revealed substrate can be etched, covered with deposited material, or otherwise modified. Remaining photoresist protects other portions of the substrate from such modification.

To increase manufacturing efficiencies, more than one device is sometimes prepared from a single wafer. The devices may be the same or different. Each device requires that a subset of the wafer be imaged with a pattern. In some cases, the pattern is sequentially imaged onto different subsets. Sequential imaging can be performed for several reasons. Optical aberrations can prevent achieving adequate pattern focus quality over larger areas of the wafer. Even in the absence of optical aberrations, the spatial properties of the wafer and photoresist may also prevent achieving adequate pattern focus over large areas of the wafer. Aspects of the relationship between the spatial properties of the wafer/resist and focus quality are discussed next.

Referring to back to FIG. 10b, object 30 is shown with a number N subsets $40_i$, each smaller than a total area 41 the object to be imaged. Within each subset $40_i$, spatial property variations, e.g., height and slope variations of the wafer or photoresist, are typically smaller than when taken over the total area 41. Nonetheless, the wafer or photoresist of different subsets $40_i$ typically have different heights and slopes. For example, layer 34 exhibits thicknesses $\Delta t_1$ and $\Delta t_2$, which vary the height and slope of surface 39 (FIG. 10a). Thus, each subset of the object may have a different spatial relationship with the photolithography imager. The quality of focus is related to the spatial relationship, e.g., the distance between the object and the photolithography imager. Bringing different subsets of the object into proper focus may require relative repositioning of the object and imager. Because of the object height and slope variations, proper subset focus cannot be achieved solely by determining the position and orientation of the object with respect to a portion of the object that is remote to the imaged subset, e.g., a side 43 of the object.

Proper focus can be achieved by determining a spatial property of an object within a subset of the object to be imaged (or otherwise processed). Once the position of the subset has been determined, the object (and/or a portion of the photolithography imager) can be moved, e.g., translated, rotated, and/or tilted, to modify the position of the subset with respect to a reference, e.g., a portion of the photolithography imager. The determination and movement (if necessary) can be repeated for each subset to be imaged.

The determination of the spatial property of the subset can include determining a position and/or height of one or more points of an outer surface of a thin layer of the object, the one or more points lying within the subset of the object to be imaged. For example, the position and orientation of the outer surface 39 of subset $40_2$ (FIG. 1a) can be determined based upon the positions of points $42_1$-$42_3$ within the subset. The determination of the spatial property of the subset to be imaged can include using an interferometer to illuminate the subset with light and detecting an interference signal including light reflected from the illuminated subset. In some embodiments, a plurality of subsets are simultaneously imaged with light to obtain a plurality of interference signals. Each interference signal is indicative of one or more spatial properties of a subset. Thus, the interference signals can be used to prepare an image indicative of the topography of the object over a plurality of the subsets. During photolithography of the subsets, the wafer is positioned based upon the topography of the individual subsets as determined from the plurality of interference signals. Hence, each subset can be positioned for optimum focus with respect to the photolithography apparatus.

Detecting an interference signal from each subset of an object to be imaged can include detecting light reflected from the subset and reference light over an OPD range that is at least as large as a coherence length of the detected light. For example, the light may be detected at least over its coherence length. In some embodiments, the interferometer is configured so that the light reflected from the illuminated subset is dominated by light reflected from either an outer interface (such as outer surface 39) or an inner interface (such as interface 36). In some embodiments, a spatial property of an object is determined based on only a portion of the interference signal. For example, if the interference signal includes two or more overlapping interference patterns, a spatial property of the object can be determined based upon a portion of one of the interference patterns that is dominated by contributions from a single interface of the object.

Copper Interconnect Structures and Chemical Mechanical Polishing

It is becoming common among chip makers to use the so-called 'dual damascene copper' process to fabricate electrical interconnects between different parts of a chip. This is an example of a process which may be effectively characterized using a suitable surface topography system. The dual damascene process may be considered to have six parts: (1) an interlayer dielectric (ILD) deposition, in which a layer of dielectric material (such as a polymer, or glass) is deposited onto the surface of a wafer (containing a plurality of individual chips); (2) chemical mechanical polishing (CMP), in which the dielectric layer is polished so as to create a smooth surface, suitable for precision optical lithography, (3) a combination of lithographic patterning and reactive ion etching steps, in which a complex network is created comprising narrow trenches running parallel to the wafer surface and small vias running from the bottom of the trenches to a lower (previously defined) electrically conducting layer, (4) a combination of metal deposition steps which result in the deposition of copper trenches and vias, (5) a dielectric deposition step in which a dielectric is applied over the copper trenches and vias, and (6) a final CMP step in which the excess copper is removed, leaving a network of copper filled trenches (and possibly vias) surrounded by dielectric material.

Figure 11A:
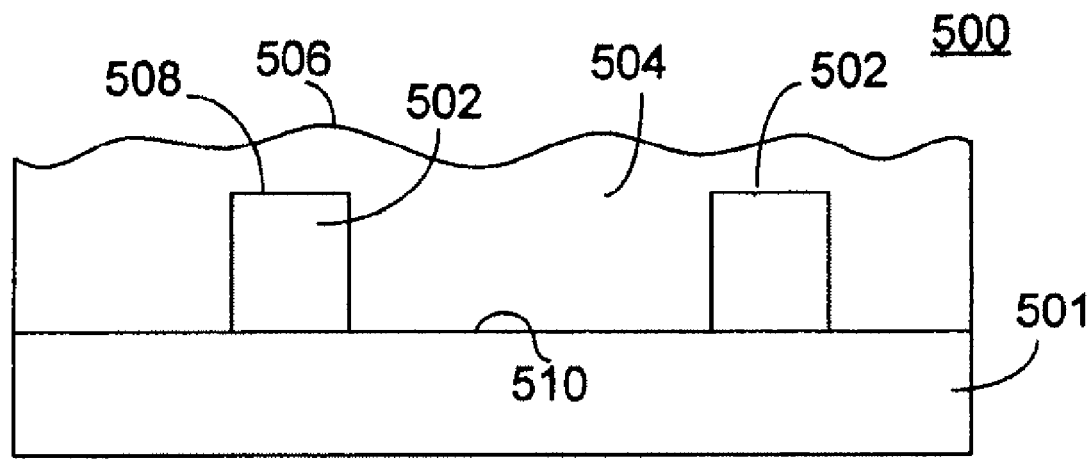
FIGS. 11a and 11b are exemplary structures having copper interconnects.

Referring to FIG. 11a, a device 500 is exemplary of the a film structure resulting from the deposition of a dielectric 504 over copper features 502 deposited on a substrate 501. The dielectric 504 has a non-uniform outer surface 506 exhibiting height variations therealong. Interference signals obtained from device 500 can include interference patterns resulting from surface 506, an interface 508 between copper features 502 and dielectric 504, and an interface 510 between substrate 501 and dielectric 504. The device 500 may include a plurality of other features that also generate interference patterns.

Figure 11B:
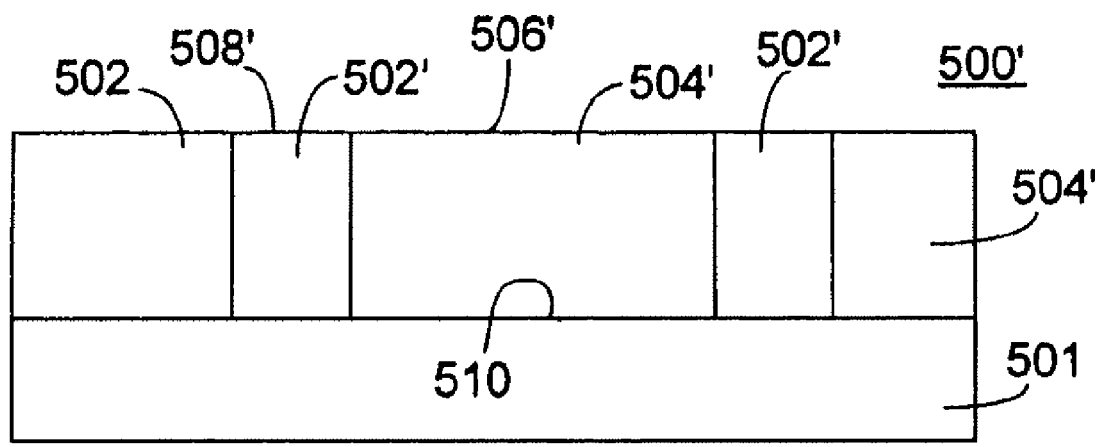

Referring to FIG. 11b, a device 500' illustrates the state of device 500 after the final CMP step. The upper surface 506 has been planarized to a surface 506', and interface 508 may now be exposed to the surroundings. Interface 510 at the substrate surface remains intact. Device performance and uniformity depends critically on monitoring the planarization of surface 504. It is important to appreciate that the polishing rate, and therefore the remaining copper (and dielectric) thickness after polishing, depends strongly and in a complex manner on the polishing conditions (such as the pad pressure and polishing slurry composition), as well as on the local detailed arrangement (i.e., orientation, proximity and shape) of copper and surrounding dielectric regions. Hence, portions of surface 506 over copper elements 502 may etch at different rates than other portions of surface 506. Additionally, once interface 508 of copper elements 502 is exposed, the dielectric and copper elements may exhibit different etch rates.

This 'position dependent polishing rate' is known to give rise to variable surface topography on many lateral length scales. For example, it may mean that chips located closer to the edge of a wafer on aggregate are polished more rapidly than those located close to the center, creating copper regions which are thinner than desired near the edges, and thicker than desired at the center. This is an example of a 'wafer scale' process nonuniformity—i.e., one occurring on length scale comparable to the wafer diameter. It is also known that regions which have a high density of copper trenches polish at a higher rate than nearby regions with low copper line densities. This leads to a phenomenon known as 'CMP induced erosion' in the high copper density regions. This is an example of a 'chip scale' process non-uniformity—i.e., one occurring on a length scale comparable to (and sometimes much less than) the linear dimensions of a single chip. Another type of chip scale nonuniformity, known as 'dishing', occurs within single copper filled trench regions (which tend to polish at a higher rate than the surrounding dielectric material). For trenches greater than a few microns in width dishing may become severe with the result that affected lines later exhibit excessive electrical resistance, leading to a chip failure.

CMP induced wafer and chip scale process nonuniformities are inherently difficult to predict, and they are subject to change over time as conditions within the CMP processing system evolve. To effectively monitor, and suitably adjust the process conditions for the purpose of ensuring that any non-uniformities remain within acceptable limits, it is important for process engineers to make frequent non-contact surface topography measurements on chips at a large number and wide variety of locations. This is possible using embodiments of the interferometry methods and systems described above.

In some embodiments one or more spatial properties, e.g., the topography of surface 506 and/or the thickness of dielectric 504, are monitored by obtaining low coherence interference signals from the structure before and/or during CMP. Based on the spatial properties, the polishing conditions can be changed to achieve the desired planar surface 506'. For example, the pad pressure, pad pressure distribution, polishing agent characteristics, solvent composition and flow, and other conditions can be determined based on the spatial properties. After some period of polishing, the spatial property can again be determined and the polishing conditions changed as needed. The topography and/or thickness is also indicative of the end-point at which, e.g., surface 504' is achieved. Thus, the low coherence interference signals can be used to avoid depressions caused by over polishing different regions of the object. The low coherence interference methods and systems are advantageous in this respect because spatial properties of the device, e.g., the relative heights of the surface of the dielectric (a) over copper elements 502 and (b) over substrate surface 510 but adjacent copper elements 502 can be determined even in the presence of the multiple interfaces.

Solder Bump Processing

Figure 12A:
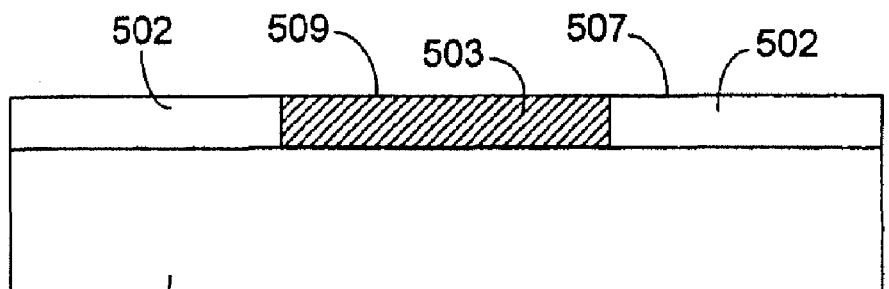
FIGS. 12a and 12b are exemplary structures formed during solder bump processing.
Figure 12B:
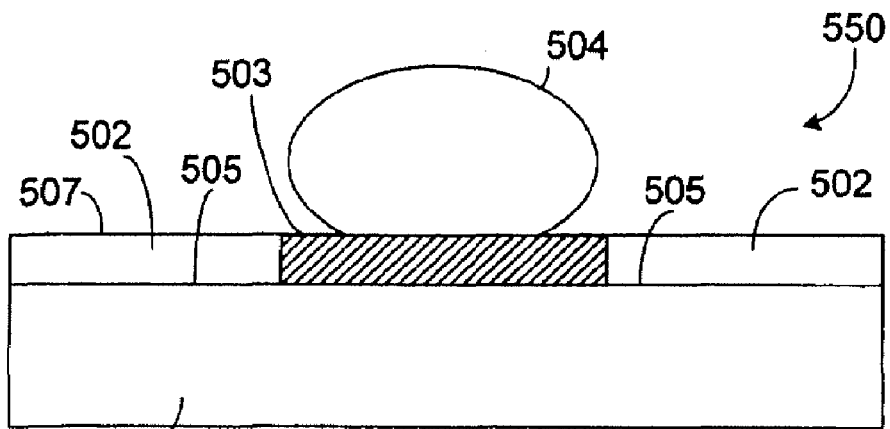

Referring to FIGS. 12a and 12b, a structure 550 is exemplary of a structure produced during solder bump processing. Structure 550 includes a substrate 551, regions 502 non-wettable by solder, and a region 503 wettable by solder. Regions 502 have an outer surface 507. Region 503 has an outer surface 509. Accordingly, an interface 505 is formed between regions 502 and substrate 501.

During processing a mass of solder 504 is positioned in contact with wettable region 503. Upon flowing the solder, the solder forms a secure contact with the wettable region 503. Adjacent non-wettable regions 502 act like a dam preventing the flowed solder from undesirable migration about the structure. It is desirable to know spatial properties of the structure including the relative heights of surfaces 507, 509 and the dimensions of solder 504 relative to surface 502. As can be determined from other discussions herein, structure 550 includes a plurality of interfaces that may each result in an interference pattern. Overlap between the interference patterns prevents accurate determinate of the spatial properties using known interference techniques. Application of the systems and methods discussed herein allow the spatial properties to be determined.

Spatial properties determined from structure 550 can be used to change manufacturing conditions, such as deposition times for layers 502,503 and the amount of solder 504 used per area of region 503. Additionally, heating conditions used to flow the solder can also be changed based on the spatial properties to achieve adequate flow and or prevent migration of the solder.

Liquid Crystal Displays

Figure 13:
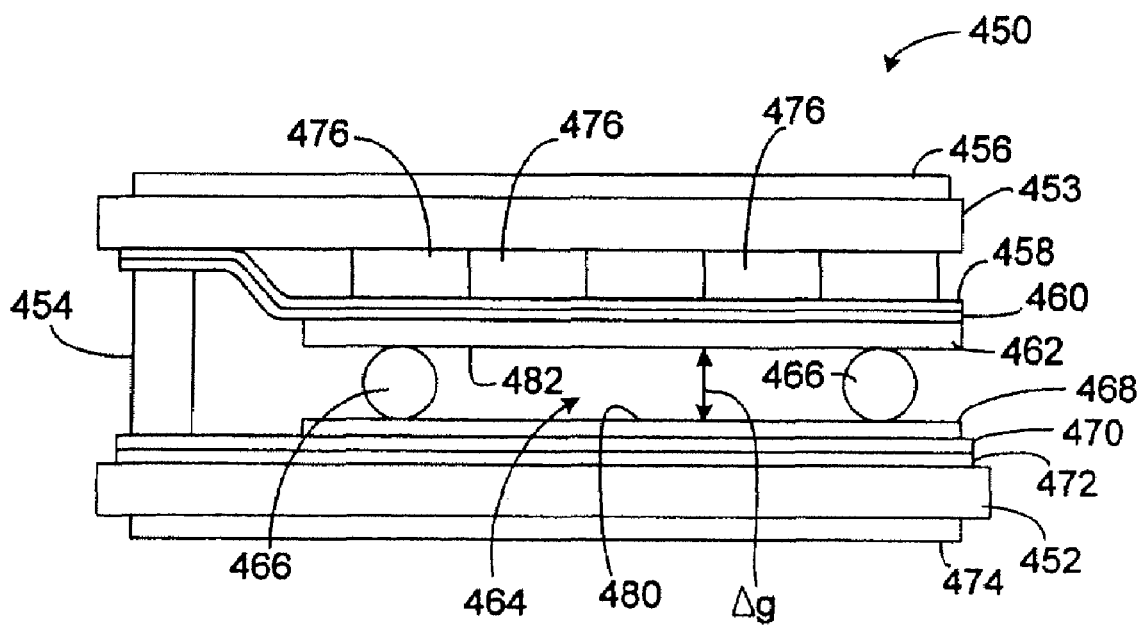
FIG. 13 is a portion of an exemplary liquid crystal display.

Referring to FIG. 13, a passive matrix LCD 450 is composed of several layers. The main parts are two glass plates 452,453 connected by seals 454. A polarizer 456 is applied to the front glass plate 453 in order to polarize incoming light in a single direction. The polarized light passes through the front glass plate 453. An Indium Tin Oxide (ITO) layer 458 is used as an electrode. A passivation layer 460, sometimes called hard coat layer, based on SiOx is coated over the ITO 458 to electrically insulate the surface. Polyimide 462 is printed over the passivation layer 460 to align the liquid crystal fluid 464. The liquid crystal fluid is sensitive to electric fields and changes orientation when an electric field is applied. The liquid crystal is also optically active and rotates the polarization direction of the incoming light. The cell gap $\Delta g$, i.e., thickness of the liquid crystal layer 464, is determined by spacers 466, which keep the two glass plates 452,453 at a fixed distance. When there is no electric potential from the front plate 453 to the rear plate 452, the polarized light is rotated 90° as it passes through the liquid crystal layer 464. When an electric potential is applied from one plate to the other plate the light is not rotated. After the light has passed through the liquid crystal layer 464, it passes through another polyimide layer 468, another hard coat layer 470, a rear ITO electrode 472, and the rear glass plate 452. Upon reaching a rear polarizer 474, the light either transmitted through or absorbed, depending on whether or not it has been rotated 90°. The cell 450 may include filters 476 or other colorizing elements to provide a color display.

The cell gap $\Delta g$ determines to a great extent the optoelectrical properties of the LCD, e.g., the contrast ratio and brightness. Cell gap control during manufacturing is critical to obtaining uniform, quality displays. The actual cell gap may differ from the dimensions of spacers 466 because, during assembly, pressure or vacuum is applied to introduce the liquid crystal medium, seals 454 cure and may change dimensions, and the added liquid crystal medium generates capillary forces between plates 452,453. Both before and after adding the liquid crystal medium 464, surfaces 480,482 of plates 452,453 reflect light that results in an interference pattern indicative of the cell gap $\Delta g$. The low coherence nature of the interference signal either itself or in combination with the described interference signal processing techniques can be used to monitor properties of the cell including the cell gap $\Delta g$ during manufacture even in the presence of interfaces formed by other layers of the cell.

An exemplary method can include obtaining a low coherence interference signal including interference patterns indicative of the cell gap $\Delta g$ prior to adding layer 464. The cell gap (or other spatial property of the cell) is determined from the interference patterns and can be compared to a specified value. Manufacturing conditions, e.g., a pressure or vacuum applied to plates 452,453 can be changed to modify the cell gap $\Delta g$ if a difference between the specified value and the determined cell gap exceeds tolerances. This process can be repeated until achieving the desired cell gap. Liquid crystal medium is then introduced into the cell. The amount of liquid crystal medium to be added can be determined from the measured spatial property of the cell. This can avoid over- or underfilling the cell. The filling process can also be monitored by observing interference signals from the surfaces 480,482. Once the cell has been filed, additional low coherence interference patterns are obtained to monitor the cell gap Δg (or other spatial property). Again, the manufacturing conditions can be changed so that the cell gap is maintained or brought within tolerances.

Laser Scribing and Cutting

Lasers can be used to scribe objects in preparation for separating different, concurrently manufactured structures, e.g., microelectronics structures. The quality of separation is related to the scribing conditions, e.g., laser focus size, laser power, translation rate of the object, and scribe depth. Because the density of features of the structure may be large, the scribe lines may be adjacent thin film or layers of the structures. Interfaces associated with the thin film or layers may create interference patterns that appear when interferometry is used to determine the scribe depth. The methods and systems described herein can be used to determine the scribe depth even in the presence of such adjacent films or layers.

An exemplary method can include scribing one or more electronic structures and separating the structures along the scribe lines. Before and/or after separation, low coherence interference signals can be used to determine the depth of scribe. Other scribing conditions are known, e.g., laser spot size, laser power, translation rate. The scribe depth can be determined from the interference signals. The quality of separation as a function of the scribing conditions, including the scribe depth, can be determined by evaluating the separated structures. Based on such determinations, the scribing conditions necessary to achieve a desired separation quality can be determined. During continued manufacturing, low coherence interference signals can be obtained from scribed regions to monitor the process. Scribing conditions can be changed to maintain or bring the scribe properties within tolerances.

EXAMPLES

Determining a spatial property of a measurement object is further described the context of the following non-limiting examples.

1. Determining a Spatial Property of a Single-Surface Measurement Object

Referring to back to FIG. 1, interference signal 150 is but one of a total 101 interference signals representing a linear trace across the object surface. For convenience, the remaining 100 interference signals are not shown. The silicon dioxide object surface has an approximately spherical profile with PV=600 nm. The irradiation wavelength is 550 nm with a bandwidth of 100 nm. The bandwidth is Gaussian in wavenumber. The numerical aperture is 0.01 for normal incidence, collimated light. Each interference signal has a full scale digital resolution of 256 grey scale steps. The average signal strength is 20 grey levels amplitude AC above 65 grey levels DC. The signals have random noise having a standard deviation of 2 grey levels.

The 101 interference signals are transformed to an inverse domain using the Fourier transform. Referring to FIG. 14*a*, the magnitude of the Fourier transform 205 of interference signal 200 has a peak located at about 3.7 cycles per micron of PLD. The transformed interference signals are used to prepare a transformed template including contributions from all of the transformed interference signals. A region of interest 202 is shown as centered about the peak.

Figure 14B:
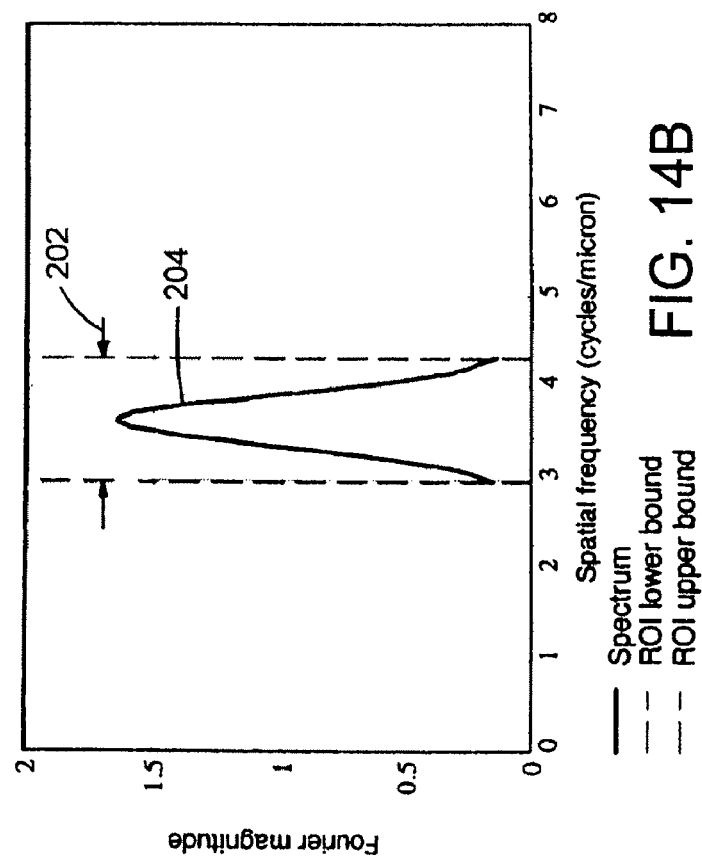
FIG. 14b is a template in the transformed domain including a positive-frequency portion of a field-averaged spectrum $\tilde{q}_{sys}$. The template includes contributions from a plurality of interference signals from different points of an object.
Figure 14A:
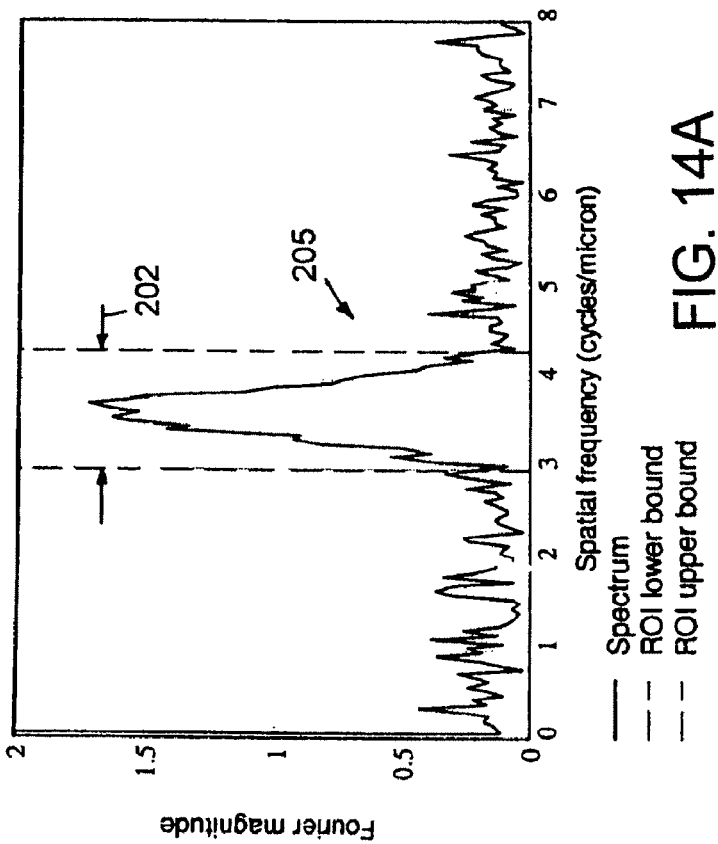
FIG. 14a illustrates a positive-frequency portion of the magnitude spectrum of the Fourier transform of the interference signal of FIG. 2.

Referring to FIG. 14*b*, a transformed interference signal 204 that includes contributions from the 101 transformed interference signals has a substantially higher signal to noise ratio (S/N) than each transformed interference signals as can be seen upon comparing FIGS. 10*a* and 10*b*.

Figure 15:
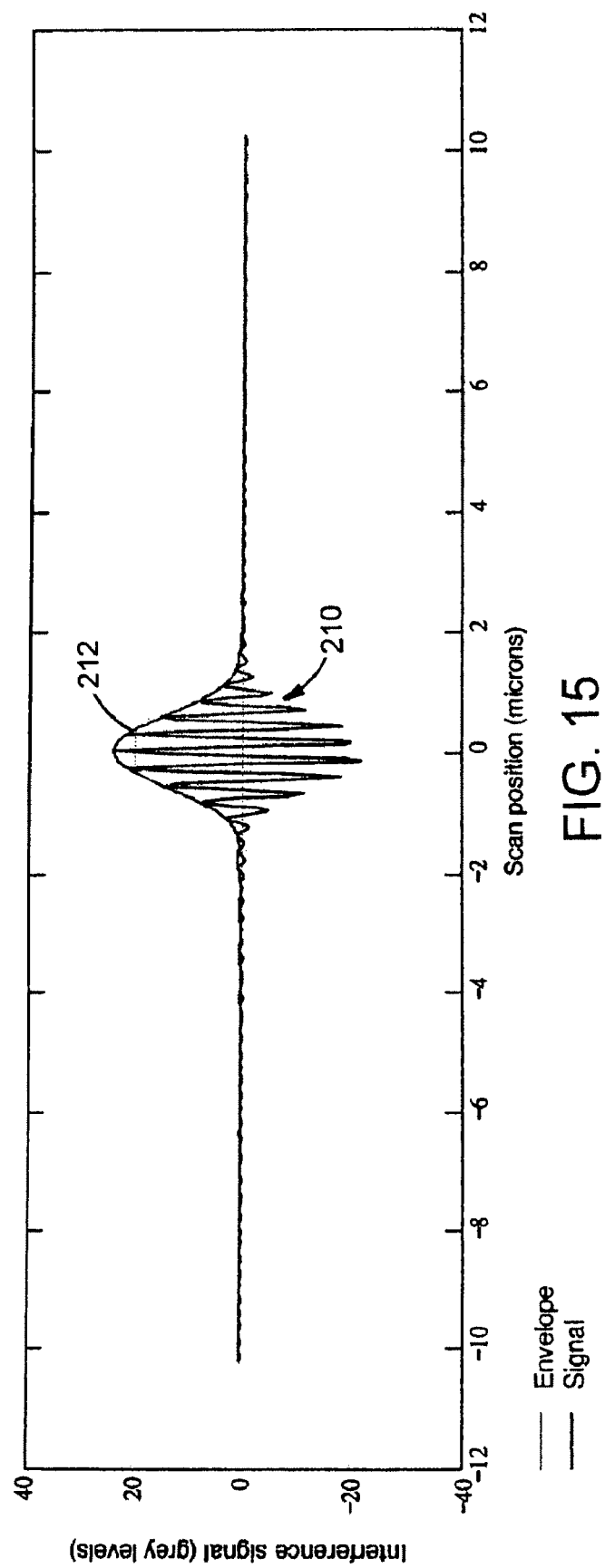
FIG. 15 illustrates a template determined from a plurality of interference signals and also illustrates the envelope under which fringes of the template decay. The template is identical to the template of FIG. 3 except for not having been subjected to a window function.

Referring to FIG. 15, a template 210 includes a plurality of fringes that decay according to an envelope 212. Template 210 has a substantially higher S/N than each interference signal as can be seen upon comparing FIGS. 1 and 11. Template 212 further differs from the 101 measurement interference signals (e.g., set 150) in that contributions from the object surface height, phase differences between different interference signals, and the DC bias have been removed from the template.

Referring back to FIG. 2, a windowed template 215 represents the product of template 212 and a window function 217, with values of template 212 outside of the window function set to zero.

Figure 16:
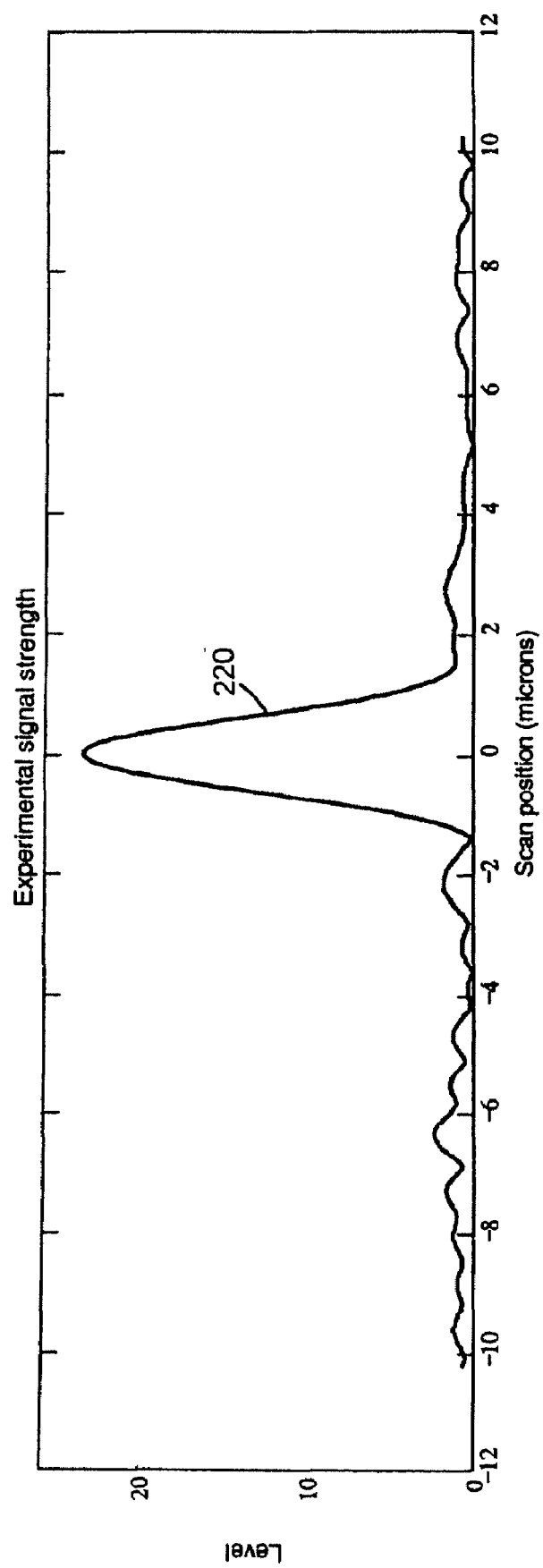
FIG. 16 illustrates the product of the amplitude of the fringes and envelope of the interference signal of FIG. 2.

Referring to FIG. 16, a function 220 is given by the product of the amplitude of the AC portion of the oscillating signal and the envelope describing the decay of the fringes ($AC_{ex}m_{ex}$) of interference signal 200 of FIG. 1.

Figure 17:
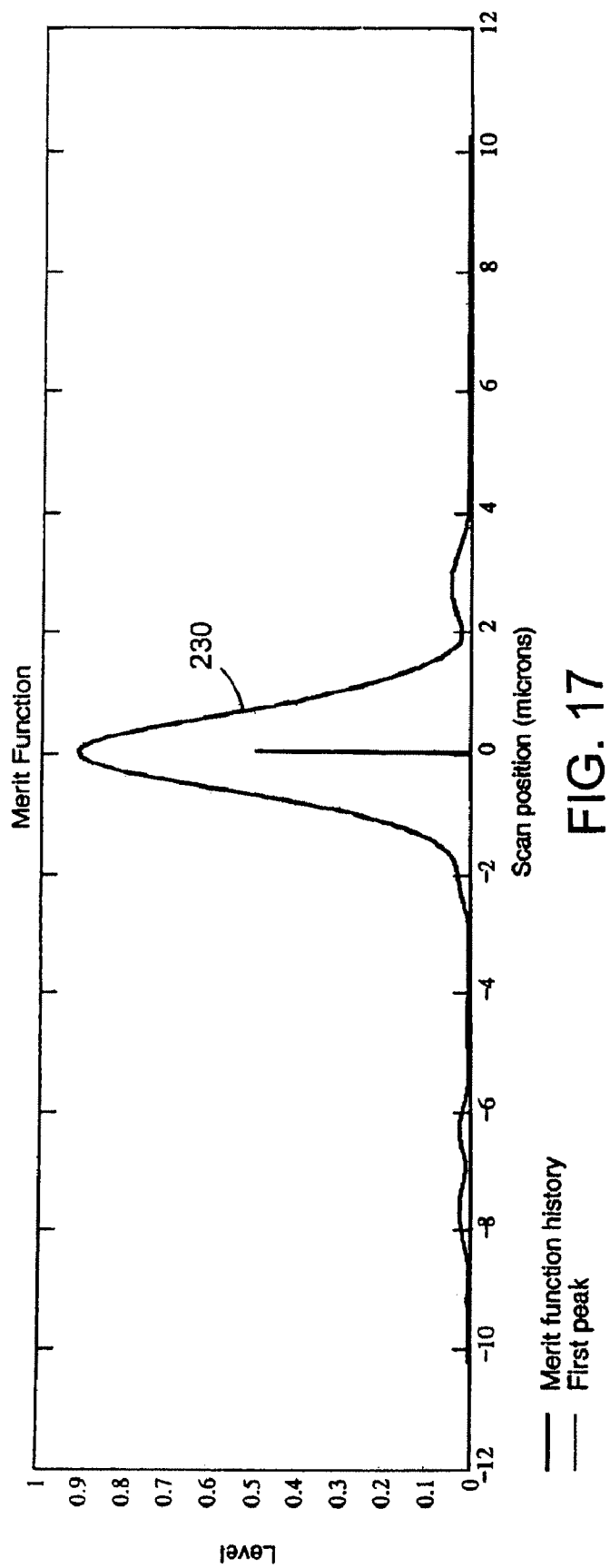
FIG. 17 illustrates a merit function determined from the windowed template of FIG. 3 and the interference signal of FIG. 2.

Referring to FIG. 17, a merit function 230 obtained by complex cross-correlation of the windowed template of FIG. 2 and the interference signal 150 of FIG. 1.

Figure 18:
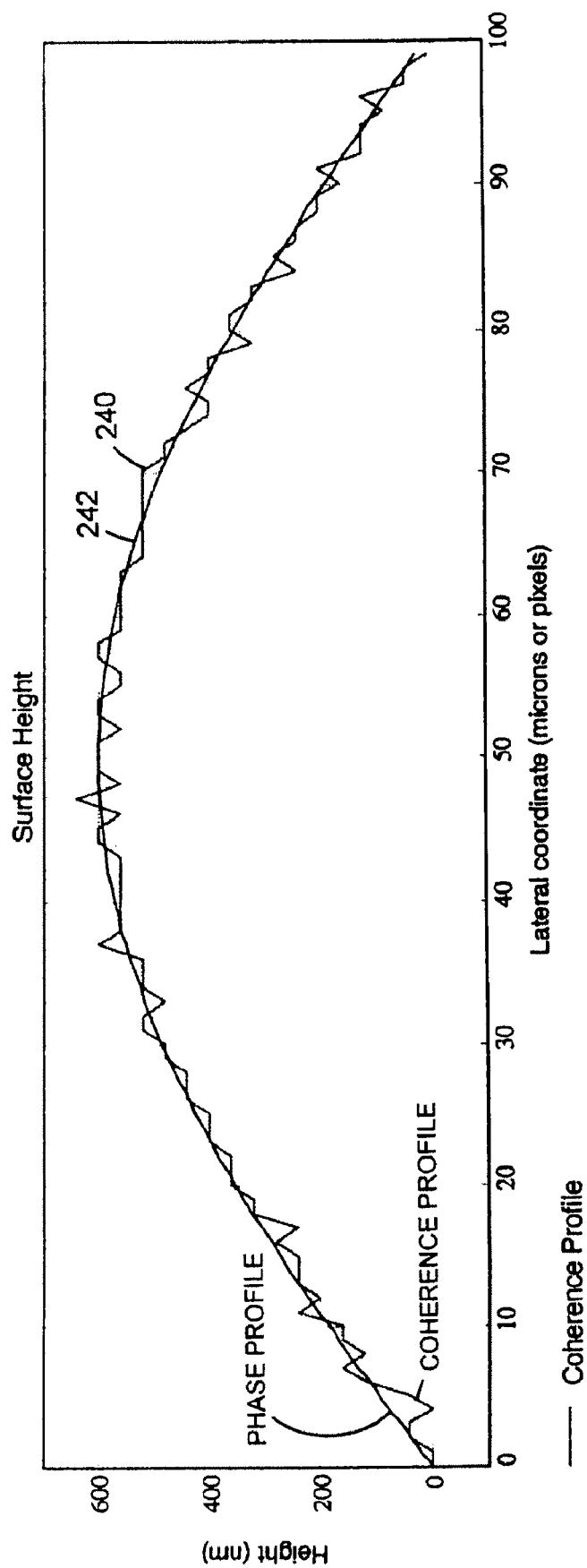
FIG. 18 illustrates height profiles of the object used to acquire the interference signal of FIG. 2.

Referring to FIG. 18, the surface height of the measurement object is shown as a function of lateral position across the object surface as determined from the template 215 and 101 interference signals using a coherence profile 240 $h_\Theta$ approach and phase profile 242 $h_\theta$ approach.

2. Determining a Spatial Property of a Measurement Object with Thin Film

Figure 19:
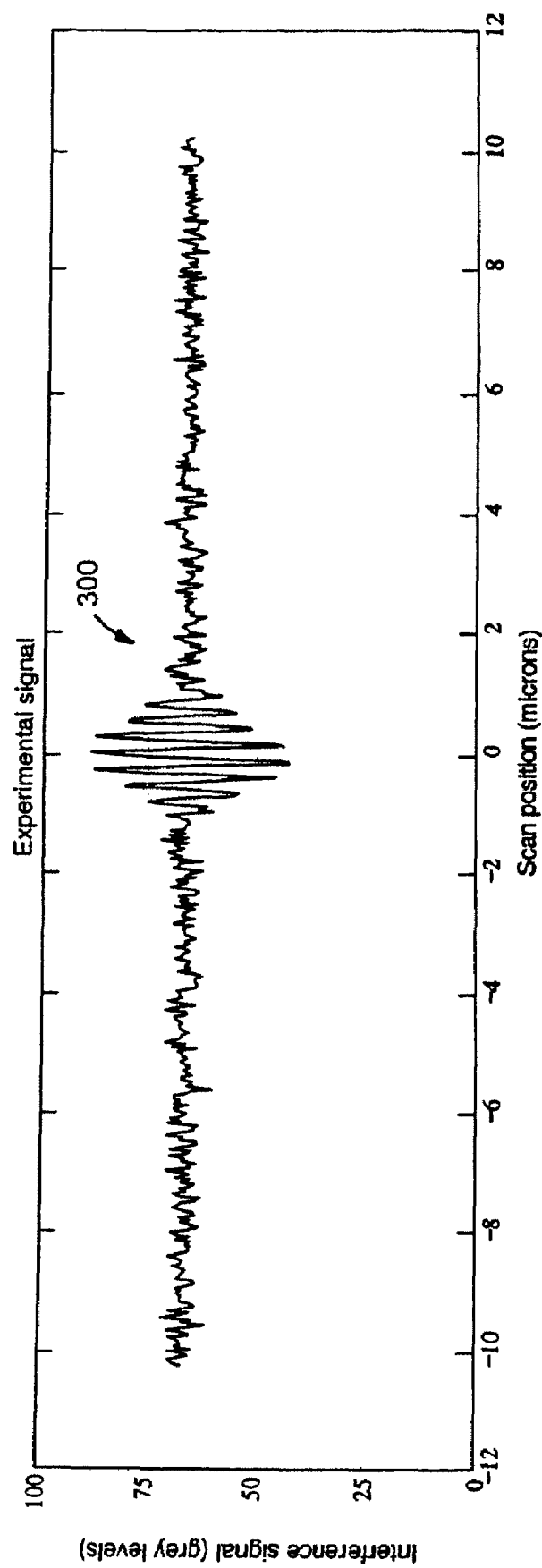
FIG. 19 illustrates one of a second set of 101 simulated reference interference signals $I_{ex}$ acquired from the silicon substrate used to acquire the signal of FIG. 2. The scan position is the $\zeta$ coordinate.

Referring to FIG. 19, a reference interference signal 300 is one of 101 reference interference signals obtained as from the same reference object used in Example 1.

Referring to FIGS. 20*a* and 20*b*, the 101 reference interference signals are transformed to an inverse domain by Fourier transformation. The magnitude of the Fourier transform 305 of interference signal 300 has a peak located at about 3.7 cycles per micron of OPD. A transformed interference signal 304 that includes contributions from the magnitudes of the 101 transformed interference signals has a substantially higher signal to noise ratio (S/N) than each transformed interference signals as can be seen upon comparing FIGS. 20*a* and 20*b*.

Figure 21:
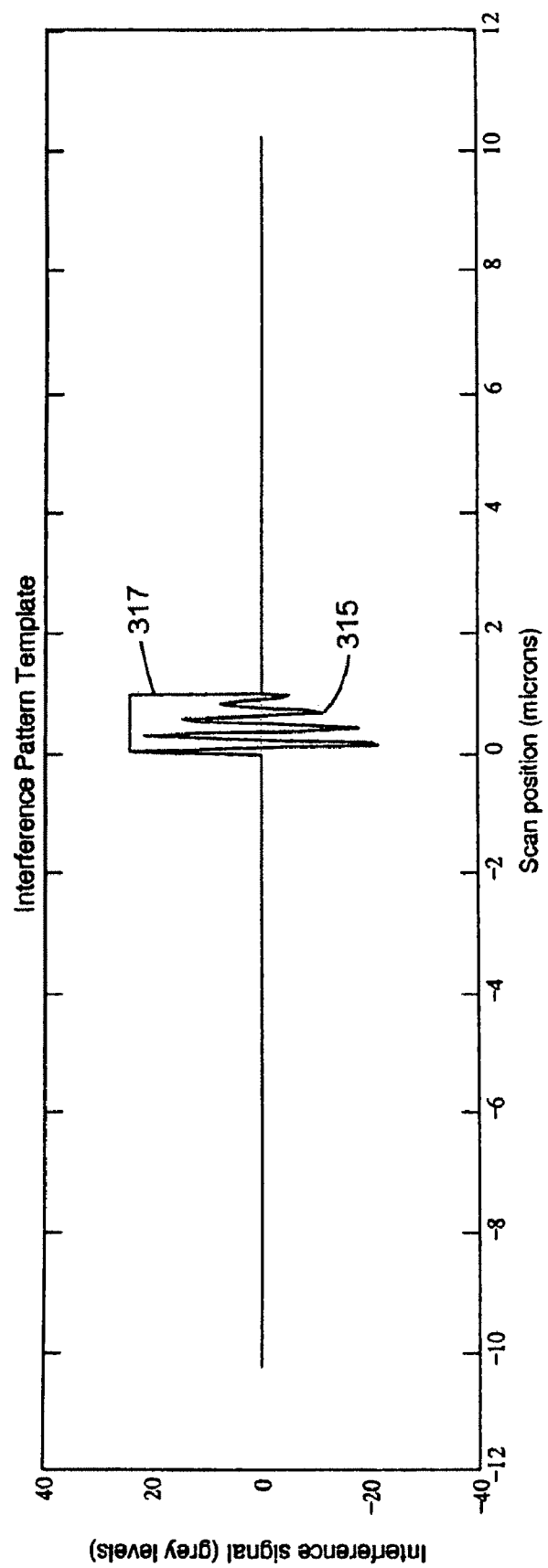
FIG. 21 is an asymmetric template determined from the product of a template derived from the data of FIG. 19 and an asymmetric windowing function. Only the right-hand portion of the template derived from the data of FIG. 19 has been retained.

A template (not shown) having characteristics similar to template 212 of FIG. 15 is prepared from the 101 transformed interference signals. Referring to FIG. 21, an asymmetric windowed template 315 represents the product of the template and a window function 317, with values of the template outside of the window function 317 set to zero. The left boundary of the template corresponds to the peak of the envelope that determines the decay of the fringes.

Figure 22:
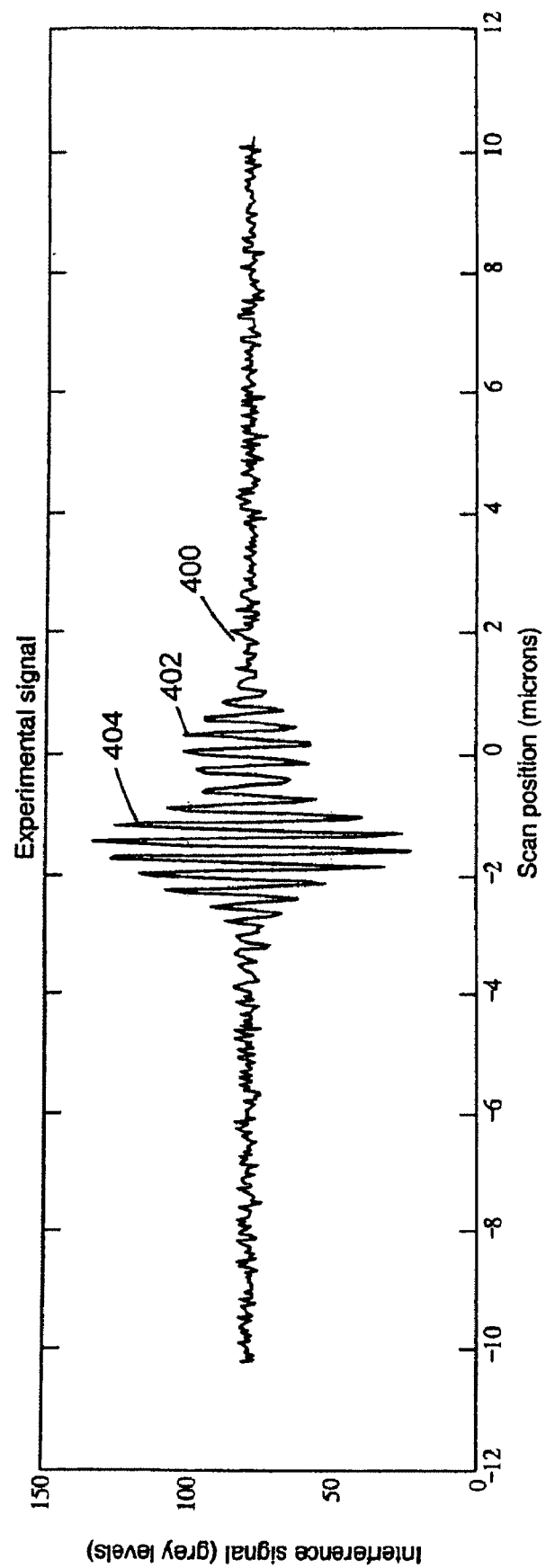
FIG. 22 illustrates one of 101 simulated interference signals $I_{ex}$ acquired from a silicon substrate having a thin film. Other than the presence of the thin film, the silicon substrate is the same as that used to acquire the data of FIG. 19. The scan position is the $\zeta$ coordinate.

Referring to FIG. 22, a measurement interference signal 400 is obtained from a measurement object including silicon dioxide film on a silicon substrate ($SiO_2$ on Si). The substrate of the object is the same as that used to acquire the reference interference signals, i.e., the substrate is the same as the measurement object used in Example 1. The film thickness ranges from 900 nm at edges to 1500 nm in the middle (at pixel 50). A linear strip of 101 measurement interference signals are acquired under the same conditions as for Example 1.

As seen in FIG. 22, interference signal 400 includes a first and second interference patterns 402,404 respectively resulting from the substrate-film interface and the film-air interface. The interference patterns are partially overlapped.

Figure 23:
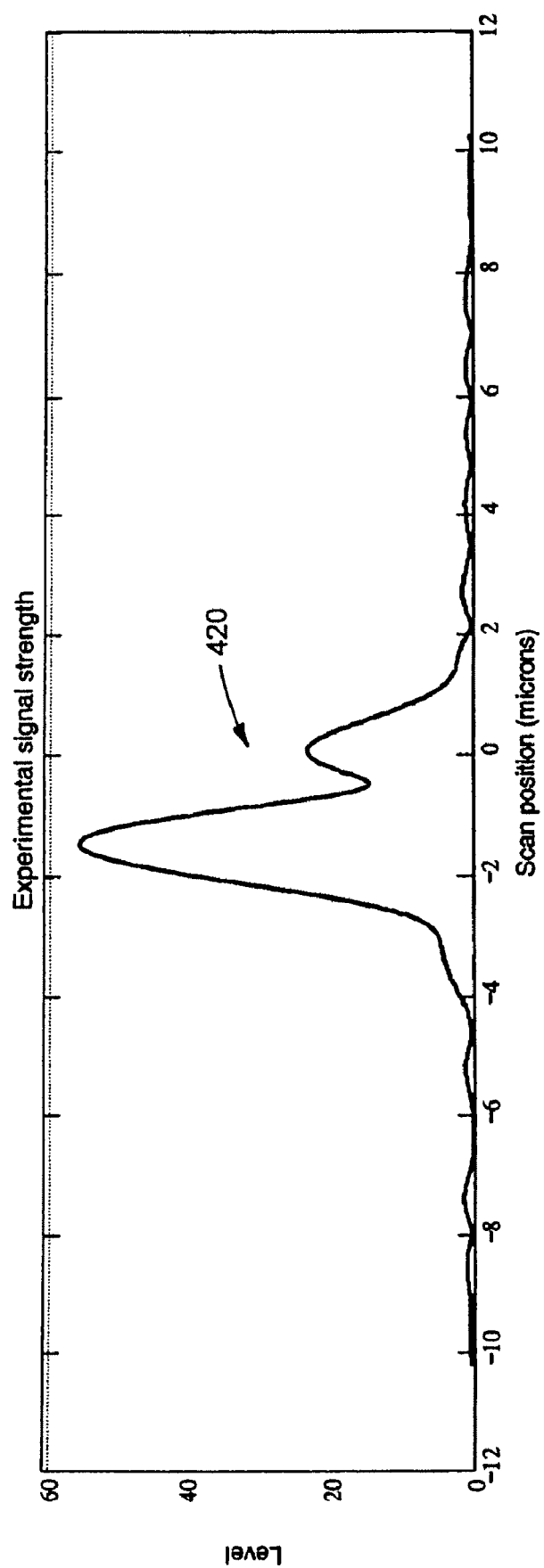
FIG. 23 illustrates the product of the amplitudes of the fringes and envelopes of the interference signal of FIG. 22.

Referring to FIG. 23, a function 420 is given by the product of the amplitude of the AC portion of the oscillating signal and the envelopes describing the decays of the fringes of the first and second interference patterns 402,404 interference signals 400 of FIG. 22.

Figure 24:
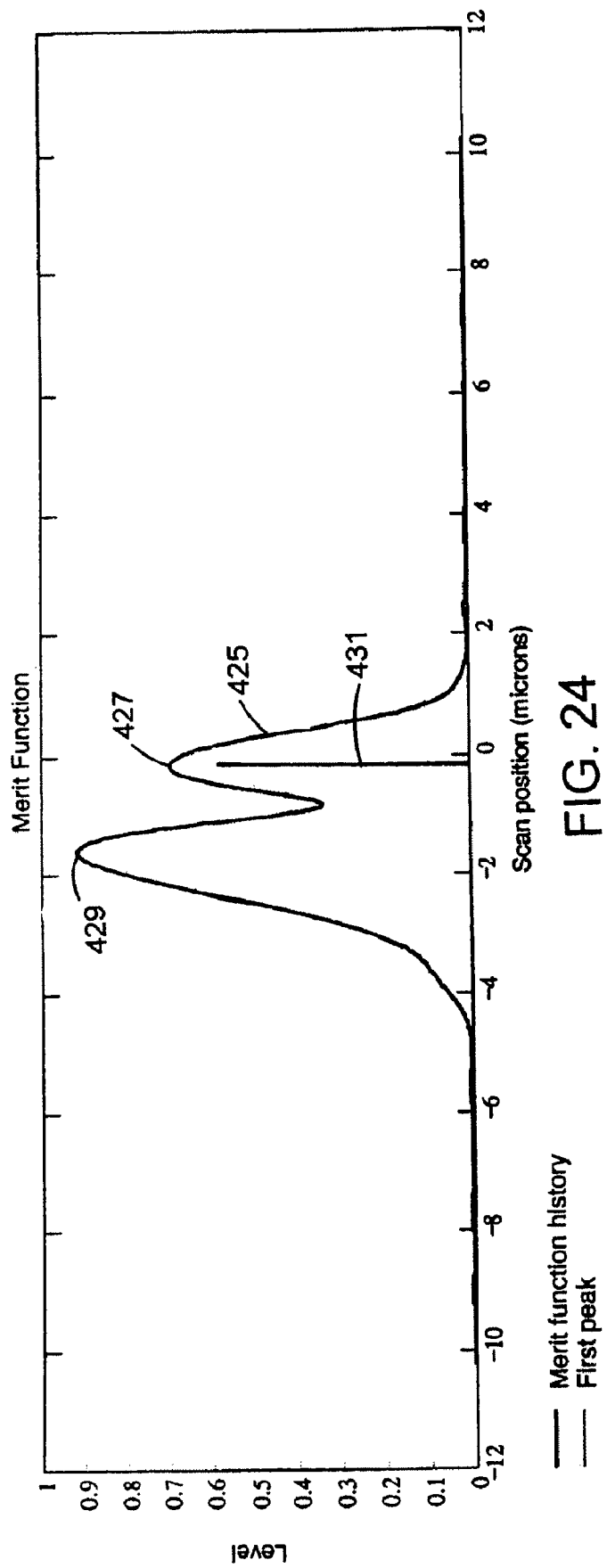
FIG. 24 illustrates a merit function determined from the asymmetric template of FIG. 21 and the data of FIG. 22.

Referring to FIG. 24, a merit function 425 includes first and second peaks 427,429 as a function of scan position. Merit function 425 is obtained by cross-correlating the asymmetric template of FIG. 22 with the interference signal of FIG. 23. Each point of the cross-correlation is normalized as discussed with respect to Eq. 30. A line 431 indicates the location of the first peak position $\zeta_{best}$ with respect to scan position. The first peak position $\zeta_{best}$ indicates the location of the film-air interface.

Figure 25:
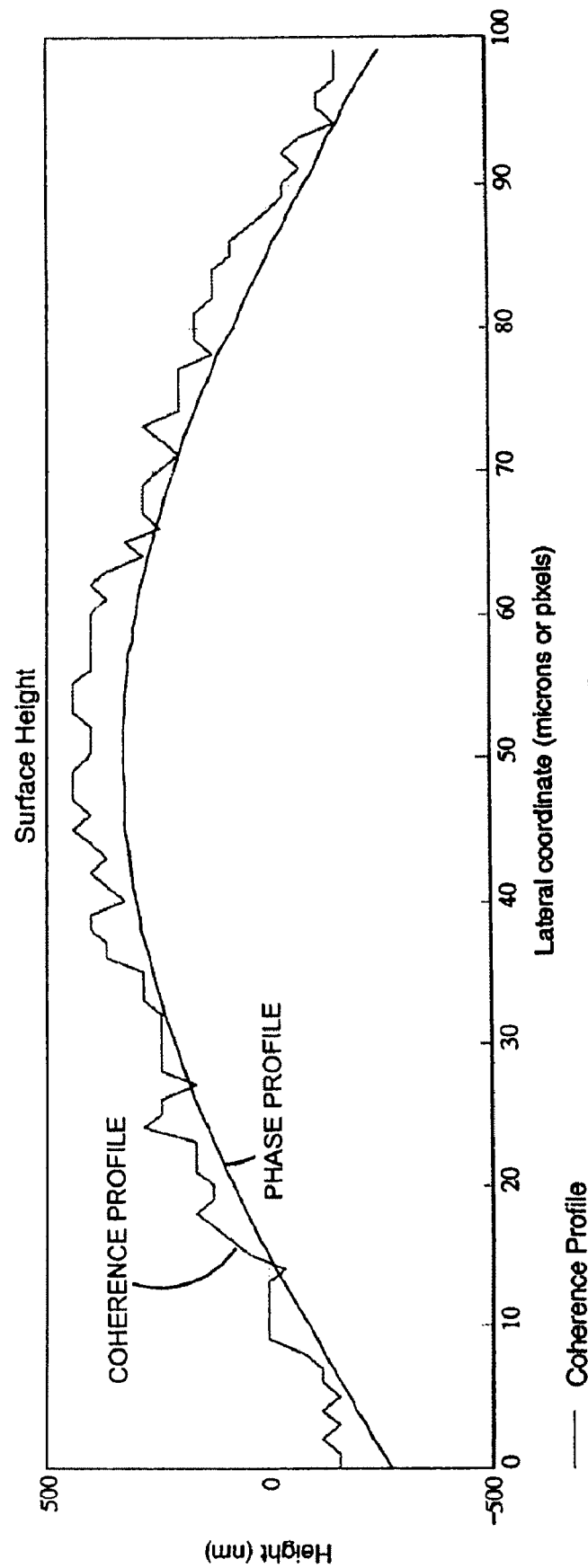
FIG. 25 illustrates height profiles of the substrate-film interface of the silicon substrate used to acquire the data of FIG. 22 as determined using the template of FIG. 21 and the data of FIG. 22.

Referring to FIG. 25 height profiles for the film-air interface are shown. A profile 440 $h_\Theta$ (coherence) is determined from the using a coherence approach and a height profile 442 $h_\Theta$ (phase) is determined using a phase approach.

Other aspects, features, and embodiments are within the scope of the following claims.

What is claimed is:

1. A method comprising:
   providing an interference signal produced by an interferometer for each of multiple spatial locations of a test object comprising a thin film having a thickness of 1000 nm or less; and
   determining a surface topography for the object in the presence of the thin film based on the interference signals and a template indicative of a response of the interferometer.

2. The method of claim 1, wherein the interference signals for the test object are low coherence interference signals.

3. The method of claim 1, wherein the interferometer is a low coherence scanning interferometer.

4. The method of claim 3, wherein the low coherence scanning interferometer comprises a multi-element detector for collecting data corresponding to the interference signals from the multiple spatial locations of the test object.

5. The method of claim 1, wherein the object comprises a wafer and thin film is photoresist coating the wafer.

6. The method of claim 1, wherein the template corresponds to a truncated portion of a reference low coherence interference signal.

7. The method of claim 1, further comprising comparing the template and the low interference signal for each spatial location to determine a corresponding surface height for the determined surface topography.

8. The method of claim 7, wherein the comparing comprises cross-correlating the template with each of the low coherence interference signals.

9. The method of claim 8, wherein the cross-correlating comprises normalizing based upon a shape of the low coherence interference signal.

10. The method of claim 8, wherein the cross-correlation is a partially complex cross-correlation.

11. The method of claim 1, further comprising determining the template based on at least one interference signal obtained by the interferometer from a reference object having a known surface topography.

12. The method of claim 1, further comprising determining the template based on interference signals obtained from multiple spatial locations of a reference object, wherein the reference interference signals are processed and then averaged to determine the template.

13. The method of claim 12, wherein the processing of the reference interference signal comprises removing a linear phase component in the frequency domain removing surface height variations among the processed reference interference signals.

14. The method of claim 1, further comprising using the interferometer to produce the interference signals.

15. The method of claim 1, wherein the object is a semiconductor chip.

16. A method comprising:
   determining a surface topography for an object based on low-coherence interference signals corresponding to multiple spatial locations of the object and a template indicative of a response of a low-coherence interferometer used to produce the low coherence interference signals.

17. An apparatus comprising:
   a computer readable medium configured to cause a processor to determine a surface topography for an object in the presence of the object based on low coherence interference signals corresponding to multiple spatial locations of the object and a template indicative of a response of a low coherence interferometer used to produce the low coherence interference signals.

18. A system comprising:
   a low-coherence interferometer configured to produce multiple low-coherence interference signals corresponding to different spatial locations of a test object; and
   an electronic processor coupled to the low-coherence interferometer and configured to determine a surface topography for the test object based on the low coherence interference signals and a template indicative of a response of the low-coherence interferometer.

19. The system of claim 18, wherein the template corresponds to a truncated portion of a reference low coherence interference signal.

20. The system of claim 18, wherein the processor is further configured to compare the template to each of the interference signals in order to determine the surface topography.

21. The system of claim 20, wherein the comparing configured to be performed by the processor comprises cross-correlating the template with each of the low coherence interference signals.

22. The system of claim 21, wherein the cross-correlating comprises normalizing based upon a shape of the low coherence interference signal.

23. The system of claim 21, wherein the cross-correlation is a partially complex cross-correlation.

24. The system of claim 18, wherein the processor is further configured to determine the template based on one or more interference signals obtained by the interferometer from a reference object.

25. The method of claim 1, further comprising outputting information about the determined surface topography.

* * * * *